(12) United States Patent
Karnezos et al.

(10) Patent No.: US 7,429,786 B2
(45) Date of Patent: Sep. 30, 2008

(54) SEMICONDUCTOR PACKAGE INCLUDING SECOND SUBSTRATE AND HAVING EXPOSED SUBSTRATE SURFACES ON UPPER AND LOWER SIDES

(75) Inventors: Marcos Karnezos, Palo Alto, CA (US); Flynn Carson, Redwood City, CA (US)

(73) Assignee: Stats Chippac Ltd., Singapore (SG)

( * ) Notice: Subject to any disclaimer, the term of this patent is extended or adjusted under 35 U.S.C. 154(b) by 149 days.

(21) Appl. No.: 11/394,635

(22) Filed: Mar. 31, 2006

(65) Prior Publication Data

US 2006/0244117 A1 Nov. 2, 2006

Related U.S. Application Data

(60) Provisional application No. 60/594,711, filed on Apr. 29, 2005, provisional application No. 60/692,842, filed on Jun. 20, 2005.

(51) Int. Cl.
*H01L 23/02* (2006.01)
*H05K 1/18* (2006.01)

(52) U.S. Cl. .................... 257/686; 257/784; 257/787; 361/764; 361/776

(58) Field of Classification Search .................. None
See application file for complete search history.

(56) References Cited

U.S. PATENT DOCUMENTS

| | | | |
|---|---|---|---|
| 5,222,014 A | 6/1993 | Lin | |
| 5,229,960 A | 7/1993 | De Givry | |
| 5,340,771 A | 8/1994 | Rostoker | |
| 5,373,189 A | 12/1994 | Massit et al. | |
| 5,436,203 A | 7/1995 | Lin | |
| 5,444,296 A | 8/1995 | Kaul et al. | |
| 5,495,398 A | 2/1996 | Takiar et al. | |
| 5,550,711 A | 8/1996 | Burns et al. | |
| 5,652,185 A | 7/1997 | Lee | |

(Continued)

FOREIGN PATENT DOCUMENTS

EP 0 430 458 A2 6/1991

(Continued)

OTHER PUBLICATIONS

International Search Report and Written Opinion for corresponding International Application No. PCT/US06/11712 dated Mar. 1, 2007.

(Continued)

*Primary Examiner*—Alonzo Chambliss

(57) ABSTRACT

A semiconductor package subassembly includes a die affixed to, and electrically interconnected with, a die attach side of a first package substrate, and a second substrate having a first side and a second ("land") side, mounted over the first package with the first side of the second substrate facing the die attach side of the first package substrate, and supported by a spacer or a spacer assembly. Z-interconnection of the package and the substrate is by wire bonds connecting the first and second substrates. The assembly is encapsulated in such a way that both the land side of the second substrate (one side of the assembly) and a portion of the land side of the first package substrate (on the opposite side of the assembly) are exposed, so that second level interconnection and interconnection with additional components may be made.

15 Claims, 19 Drawing Sheets

U.S. PATENT DOCUMENTS

| | | | |
|---|---|---|---|
| 5,744,863 | A | 4/1998 | Culnane et al. |
| 5,898,219 | A | 4/1999 | Barrow |
| 5,899,705 | A | 5/1999 | Akram |
| 5,903,049 | A | 5/1999 | Mori |
| 5,977,640 | A | 11/1999 | Bertin et al. |
| 5,982,633 | A | 11/1999 | Jeansonne |
| 5,994,166 | A | 11/1999 | Akram et al. |
| 6,025,648 | A | 2/2000 | Takahashi et al. |
| 6,034,875 | A | 3/2000 | Heim et al. |
| 6,075,289 | A | 6/2000 | Distefano |
| 6,083,775 | A * | 7/2000 | Huang et al. ............... 438/118 |
| 6,118,176 | A | 9/2000 | Tao et al. |
| 6,133,626 | A | 10/2000 | Hawke et al. |
| 6,157,080 | A | 12/2000 | Tamaki et al. |
| 6,165,815 | A * | 12/2000 | Ball .......................... 438/113 |
| 6,201,266 | B1 | 3/2001 | Ohuchi et al. |
| 6,201,302 | B1 | 3/2001 | Tzu |
| 6,238,949 | B1 | 5/2001 | Nguyen et al. |
| 6,265,766 | B1 | 7/2001 | Moden |
| 6,274,930 | B1 | 8/2001 | Vaiyapuri et al. |
| 6,316,838 | B1 | 11/2001 | Ozawa et al. |
| 6,333,552 | B1 | 12/2001 | Kakimoto et al. |
| 6,340,846 | B1 | 1/2002 | LoBianco et al. |
| 6,376,904 | B1 | 4/2002 | Haba et al. |
| 6,388,313 | B1 | 5/2002 | Lee et al. |
| 6,400,007 | B1 | 6/2002 | Wu et al. |
| 6,407,456 | B1 | 6/2002 | Ball |
| 6,413,798 | B2 | 7/2002 | Asada |
| 6,414,381 | B1 | 7/2002 | Takeda |
| 6,424,050 | B1 | 7/2002 | Komiyama |
| 6,441,496 | B1 | 8/2002 | Chen et al. |
| 6,445,064 | B1 | 9/2002 | Ishii et al. |
| 6,462,421 | B1 | 10/2002 | Hsu et al. |
| 6,472,732 | B1 | 10/2002 | Terui |
| 6,489,676 | B2 | 12/2002 | Taniguchi et al. |
| 6,492,726 | B1 | 12/2002 | Quek et al. |
| 6,501,165 | B1 | 12/2002 | Farnworth |
| 6,509,639 | B1 | 1/2003 | Lin |
| 6,512,303 | B2 | 1/2003 | Moden |
| 6,538,319 | B2 | 3/2003 | Terui |
| 6,545,365 | B2 | 4/2003 | Kondo et al. |
| 6,545,366 | B2 | 4/2003 | Michii et al. |
| 6,552,423 | B2 | 4/2003 | Song et al. |
| 6,555,902 | B2 | 4/2003 | Lo et al. |
| 6,555,917 | B1 | 4/2003 | Heo |
| 6,570,249 | B1 | 5/2003 | Liao et al. |
| 6,583,503 | B2 | 6/2003 | Akram et al. |
| 6,590,281 | B2 | 7/2003 | Wu et al. |
| 6,593,647 | B2 | 7/2003 | Ichikawa |
| 6,593,648 | B2 | 7/2003 | Emoto |
| 6,593,662 | B1 | 7/2003 | Pu et al. |
| 6,599,779 | B2 | 7/2003 | Shim et al. |
| 6,607,937 | B1 | 8/2003 | Corisis |
| 6,611,063 | B1 | 8/2003 | Ichinose et al. |
| 6,621,169 | B2 | 9/2003 | Kikuma et al. |
| 6,621,172 | B2 | 9/2003 | Nakayama et al. |
| 6,649,448 | B2 | 11/2003 | Tomihara |
| 6,650,019 | B2 | 11/2003 | Glenn et al. |
| 6,667,556 | B2 | 12/2003 | Moden |
| 6,690,089 | B2 | 2/2004 | Uchida |
| 6,700,178 | B2 | 3/2004 | Chen et al. |
| 6,706,557 | B2 | 3/2004 | Koopmans |
| 6,716,670 | B1 | 4/2004 | Chiang |
| 6,734,539 | B2 | 5/2004 | Degani et al. |
| 6,734,552 | B2 | 5/2004 | Combs et al. |
| 6,737,750 | B1 | 5/2004 | Hoffman et al. |
| 6,746,894 | B2 | 6/2004 | Fee et al. |
| 6,747,361 | B2 | 6/2004 | Ichinose |
| 6,762,488 | B2 | 7/2004 | Maeda et al. |
| 6,777,799 | B2 | 8/2004 | Kikuma et al. |
| 6,777,819 | B2 | 8/2004 | Huang |
| 6,787,915 | B2 | 9/2004 | Uchida et al. |
| 6,787,916 | B2 | 9/2004 | Halahan |
| 6,794,741 | B1 | 9/2004 | Lin et al. |
| 6,794,749 | B2 | 9/2004 | Akram |
| 6,818,980 | B1 | 11/2004 | Perdon, Jr. |
| 6,828,665 | B2 | 12/2004 | Pu et al. |
| 6,835,598 | B2 | 12/2004 | Baek et al. |
| 6,838,761 | B2 | 1/2005 | Karnezos |
| 6,847,105 | B2 | 1/2005 | Koopmans |
| 6,861,288 | B2 | 3/2005 | Shim et al. |
| 6,864,566 | B2 | 3/2005 | Choi, III |
| 6,882,057 | B2 | 4/2005 | Hsu |
| 6,890,798 | B2 | 5/2005 | McMahon |
| 6,900,528 | B2 | 5/2005 | Mess et al. |
| 6,906,415 | B2 | 6/2005 | Jiang et al. |
| 6,906,416 | B2 | 6/2005 | Karnezos |
| 6,930,378 | B1 | 8/2005 | St. Amand et al. |
| 6,930,396 | B2 | 8/2005 | Kurita et al. |
| 6,933,598 | B2 | 8/2005 | Karnezos |
| 6,951,982 | B2 | 10/2005 | Chye et al. |
| 6,972,481 | B2 | 12/2005 | Karnezos |
| 7,034,387 | B2 | 4/2006 | Karnezos |
| 7,034,388 | B2 | 4/2006 | Yang et al. |
| 7,045,887 | B2 | 5/2006 | Karnezos |
| 7,049,691 | B2 | 5/2006 | Karnezos |
| 7,053,476 | B2 | 5/2006 | Karnezos |
| 7,053,477 | B2 | 5/2006 | Karnezos |
| 7,057,269 | B2 | 6/2006 | Karnezos |
| 7,061,088 | B2 | 6/2006 | Karnezos |
| 7,064,426 | B2 | 6/2006 | Karnezos |
| 7,071,568 | B1 | 7/2006 | St. Amand et al. |
| 7,081,678 | B2 | 7/2006 | Tsai |
| 7,101,731 | B2 | 9/2006 | Karnezos |
| 7,119,427 | B2 * | 10/2006 | Kim .......................... 257/686 |
| 2002/0096755 | A1 | 7/2002 | Fukui et al. |
| 2002/0130404 | A1 | 9/2002 | Ushijima et al. |
| 2003/0113952 | A1 | 6/2003 | Sambasivam et al. |
| 2003/0153134 | A1 | 8/2003 | Kawata et al. |
| 2004/0016939 | A1 | 1/2004 | Akiba et al. |
| 2004/0061213 | A1 | 4/2004 | Karnezos |
| 2004/0201087 | A1 | 10/2004 | Lee |
| 2004/0212096 | A1 | 10/2004 | Wang |
| 2006/0043556 | A1 | 3/2006 | Su et al. |
| 2006/0138631 | A1 | 6/2006 | Tao et al. |
| 2006/0189033 | A1 | 8/2006 | Kim |
| 2006/0197209 | A1 | 9/2006 | Choi et al. |
| 2006/0244157 | A1 * | 11/2006 | Carson ..................... 257/787 |

FOREIGN PATENT DOCUMENTS

| | | |
|---|---|---|
| EP | 0 652 630 A2 | 5/1995 |
| JP | 05152505 A | 6/1993 |
| JP | 2001223326 A | 8/2001 |
| KR | 20010688614 A | 7/2001 |
| KR | 2004085348 A | 10/2004 |
| WO | WO 98/50954 A1 | 11/1998 |
| WO | WO 02/084716 A2 | 10/2002 |
| WO | WO 03/032370 A2 | 4/2003 |

OTHER PUBLICATIONS

International Search Report and Written Opinion for corresponding International Application No. PCT/US06/16143 dated Apr. 27, 2007.
Kim, J. and Boruch, J., "Enabling a Microelectronic World™", AMKOR Technology, Inc. 2002 Annual Report, retrieved from Internet:<URL:http://media.corporate-ir.net/media_files/irol/11/115640/2002AnnualReport.pdf.

* cited by examiner

SEMICONDUCTOR PACKAGE INCLUDING SECOND SUBSTRATE AND HAVING EXPOSED SUBSTRATE SURFACES ON UPPER AND LOWER SIDES

CROSS REFERENCE TO RELATED APPLICATIONS

This application claims priority from U.S. Provisional Application No. 60/594,711, filed Apr. 29, 2005, titled "Stacked semiconductor package system", and this application also claims priority from U.S. Provisional Application No. 60/692,842, filed Jun. 20, 2005, titled "Semiconductor package including second substrate and having exposed substrate surfaces on upper and lower sides", both assigned to STATS ChipPAC Ltd.

This application is related to U.S. application Ser. No. 11/395,529, by Marcos Karnezos et al., titled "Semiconductor stacked package assembly having exposed substrate surfaces on upper and lower sides"; and U.S. application Ser. No. 11/397,027 by Marcos Karnezos et al., titled "Semiconductor assembly including chip scale package and second substrate and having exposed substrate surfaces on upper and lower sides", both filed Mar. 31, 2006, and both assigned to STATS ChipPAC Ltd.

BACKGROUND

This invention relates to semiconductor packaging.

Portable electronic products such as mobile phones, mobile computing, and various consumer products require higher semiconductor functionality and performance in a limited footprint and minimal thickness and weight at the lowest cost. This has driven the industry to increase integration on the individual semiconductor chips, and also to implement integration on the "z-axis," that is, by stacking chips or by stacking die packages to form a stacked package assembly (stacked multi-package module).

Stacked package assemblies are employed in applications in which there is a need to provide a high degree of functional integration in an assembly having a minimal footprint and thickness. Portable telecommunications devices such as cellular telephones are an example of such applications, particularly where the telecommunications device includes, for example, capabilities for capture and display or play of images, audio or video.

Examples of functions that may desirably be integrated include devices for: various processes, including digital signal (DSP), ASIC, graphics (GPU); various memories, including Flash (NAND), Flash (NOR), SRAM, DRAM, MRAM; image and video capture, including optical sensor with memory; micro-electro-mechanical systems (MEMS) with processor and memory.

The z-interconnect between packages in a stacked package assembly is a critical technology from the standpoint of manufacturability, design flexibility and cost. Stacked package assemblies integrate chips and packages by stacking and electrically interconnecting them in the z-direction using wire bonds, or solder balls, or flip chip interconnection.

Stacked packages can provide numerous advantages. Particularly, each die or more than one die can be packaged in a respective package in the stack using the most efficient first level interconnect technology for the chip type and configuration, such as wire bonding or flip chip, to maximize performance and minimize cost.

It is desirable to be able to electrically test the stacked components (die or packages), so that the component can be rejected unless it shows satisfactory performance, before the packages are stacked. This permits maximizing the yield of the final stacked package assembly. To realize this advantage in practice, the packages must be configured to be testable using established test infrastructure. Generally, testing packaged die is preferable to testing individual die, as testing individual die can result in damage to interconnection pads on the die.

Often, the manufacturer of a product (particularly for example where the product is a portable communications device such as a cellular phone) determines the dimensions of a space in which the assembly must fit. That, is the manufacturer will demand that an assembly having specified functionalities have an overall footprint (length and width) and thickness within particular specifications. Presented with such limitations, the designer must, within cost limitations, be able to select packages and a stacking design and process that meet the demands for functionality within the limitations of thickness and footprint.

Accordingly, it is desirable to choose a multi-package stack structure and stacking process that provides design flexibility for the function designer. Particularly, for example, the designer should have flexibility, without having to redesign the structure or the process: to choose packages or chips from any of a variety of available vendors, to minimize component cost; to make changes in chip or package types within the assembly, to avoid having to re-qualify a changed assembly; and to complete the assembly stacking process at the final product stage on the surface mount assembly floor, to enable product configurations demanded by the market in the shortest practical time-to-market.

Meeting rapidly changing market demands can present challenges. For example, the general timeframe for designing a consumer device such as a cellular phone is typically longer than the timeframe for market shifts. A perception may develop in the industry that a particular functionality is desirable in a consumer device (e.g., web browsing functionality in a cellular phone), and designers may build that functionality into the assemblies; then within a short time it may become evident that the demand in the marketplace is not as had been perceived, and it may be desirable to remove that functionality or to present it in the marketplace as an option. Accordingly, it is desirable to be able to configure the device "on the fly", that is, to add or remove functionalities in a device without having to redesign the entire assembly.

It is desirable also to be able to stack off-the-shelf packaged chips, such as for example memory (Flash, SRAM, DRAM), over other packages in the assembly, using surface mount assembly methods employed in the industry for assembling products such as mobile communications devices (e.g., cellular phones) and computers. The type of memory for a product, in particular, can be different for different functionalities; for instance, if image capture functionality is desired in a cellular phone, a fast memory (DRAM) may be required.

The packages employed in stacked package assemblies and the manufacturing processes must be configured to enable both the physical stacking of the packages and the formation of electrical interconnections between them, using a chosen process for a chosen structure.

Stacked multi-package assemblies generally fall into two categories, namely, so-called "Package-on-Package" (PoP) assemblies, and so-called "Package-in-Package" (PiP) assemblies.

Examples of 2-stack PoP multi-package modules are shown for example in copending U.S. application Ser. No. 10/681,572, filed Oct. 8, 2003. In one example a first package (referred to as the "bottom" package) is similar to a standard BGA, having a die affixed to and electrically connected with the die attach side (the "upper" side) of a BGA substrate, and being cavity molded to provide a mold cap covering the die and electrical connections but leaving a marginal area of the die attach side of the substrate exposed. The side of the bottom package substrate opposite the die attach side (the "lower" side, which may be referred to as the "land" side) is provided with solder balls for second level interconnection of the module with underlying circuitry such as, for example, a motherboard. A second package (referred to as the "top" package) is stacked on the bottom package and is also similar to a standard BGA, except that the solder balls provided on the land side of the top package are arranged at the periphery of the top package substrate, so that they rest upon interconnection sites at the exposed marginal area of the die attach side of the bottom package. When the peripherally arranged balls are contacted with and then reflowed onto the peripherally located interconnect sites at the bottom package, they effect the z-interconnection without interference with the mold cap of the bottom BGA. The top package die and electrical connections are also encapsulated.

The type of z-interconnect employed in the PoP module requires that the top and bottom package substrates be designed with matching pads for the z-interconnect balls. If one of the packages is exchanged for one in which the substrate has a different pad arrangement (different size or different design), then the substrate for the other package must be reconfigured accordingly. This leads to increased cost for manufacture of the multi-package module. In the PoP configuration the distance between the top and bottom packages must be at least as great as the encapsulation height of the bottom package, which may be 0.25 mm or more, and typically is in a range between 0.5 mm and 1.5 mm, depending upon the number of die and depending upon whether the die-to-substrate electrical connection is by flip chip or by wire bonds. For example, for a single wire bonded die in the bottom package a moldcap of 300 um can typically accommodate a 75 um thick die. The z-interconnect solder balls must accordingly be of a sufficiently large diameter that when they are reflowed they make good contact with the bonding pads of the bottom BGA, without contact between the land side of the top package substrate and the upper surface of the bottom package mold cap; that is, the solder ball diameter must be greater than the encapsulation height by an amount that allows for solder ball collapse during reflow, plus a tolerance for noncoplanarities between balls and substrate. A typical design difference (additional clearance) between collapsed ball height and bottom mold cap height is about 25 um. For a moldcap having a thickness about 300 um, for example, z-interconnect solder balls greater than 300 um must be employed. A larger ball diameter dictates a larger ball pitch (typically about 0.65 mm pitch for 300 um balls, for example). That in turn limits the number of balls that can be fitted in the available space in the periphery of the bottom package substrate. Furthermore the peripheral arrangement of the solder balls forces the bottom BGA to be significantly larger than the mold cap of a standard BGA. And the peripheral arrangement of the solder balls increases the overall package size (the size increases according to the number of ball rows and the ball pitch). In standard BGAs the body size can be as much as about 2-3 mm larger than the mold cap. Moreover, the top package in a PoP configuration must be made of comparable size to the bottom one even though it may contain a small chip with many fewer interconnects. Increasing package footprint, to provide greater area for ball attachment (additional rows of balls, for example), may exceed the size limits for the particular application, and in any event entails longer wire bond spans and greater substrate area, both of which increase the cost of these components. Increasing the numbers of interconnections between packages may require that the top package substrate have at least two metal layers (and often more than two) to facilitate the routing within the substrate electrical connections. It may in some applications be impractical in a PoP configuration to stack two die in the bottom package, as this causes the bottom mold cap to be even thicker, exacerbating the problems described above.

Examples of two-stack PiP modules, having z-interconnection by wire bonds between the upward-facing sides of the top and bottom package substrates, are disclosed for example in copending U.S. application Ser. No. 10/632,549, filed Aug. 2, 2003, and copending U.S. application Ser. No. 10/681,572, filed Oct. 8, 2003. In the PiP configuration, the top package may be either oriented in the same direction as the bottom package (that is, with the die attach sides of both package substrates facing the same direction); or the top package may be inverted with respect to the bottom package (that is, with the die attach sides of the respective package substrates facing one another). Second-level interconnect solder balls are provided on the land side of the bottom package substrate for connection of the module with underlying circuitry such as, for example, a motherboard. In configurations where the top package is inverted, the z-interconnection wire bonds connect wire bond sites at the land side of the top substrate with peripherally arranged wire bond sites on the die attach side of the bottom package substrate. Where the top and bottom packages are oriented the same way, the z-interconnection wire bonds connect peripherally arranged wire bond sites at the die attach side of the top substrate with peripherally arranged wire bond sites at the die attach side of the bottom package substrate. In both configurations, the top package must be smaller (narrower and/or shorter by at least 0.5 mm on each margin that has z-interconnections) than the bottom package to accommodate the wire bond process.

The PoP module or PiP module is completed by overmolding, to entirely cover the top package and the wire bond interconnects between the packages. Once the module has been overmolded, no further integration can be made. That is, the designer has no flexibility to reconfigure the assembly at the product assembly level (that is, at the surface mount assembly floor); and the original equipment manufacturer cannot mix-and-match various packages from various suppliers to reduce costs.

SUMMARY

This invention is directed to semiconductor packages, having at least one die mounted upon, and electrically connected to, a die attach side of a first package substrate, and having a second substrate mounted over the first package die. The side of the first package substrate opposite the die attach side may be referred to as the "land" side of the substrate. The second substrate has a first side facing the die attach side of the first package substrate, and a second side (which may be referred to as the "land" side of the second substrate) facing away from the die attach side of the first package substrate. Accordingly, the "land" sides of the substrates face away from one another. Z-interconnection of the first package substrate and the second substrate is by wire bonds connecting the first package substrate and the second substrate.

Generally according to the invention, the package is encapsulated in such a way that both the second substrate (at one side of the package) and a portion of the first package substrate (at the opposite side of the assembly) are exposed, so that second level interconnection and interconnection with additional components may be made.

In some embodiments, the first package die is electrically connected with the first package substrate by wire bonds, and in these embodiments the second substrate is supported over the first package die by a spacer or spacer assembly, providing sufficient space between the first side of the substrate and the top of the die to accommodate the wire loop height. The second substrate may be supported by a spacer or spacer assembly (such as a "dummy" die, for example) mounted upon the first package die; or the second substrate. may be supported by a spacer or spacer assembly (epoxy dots or piers, for example) mounted upon the first package substrate.

Z-interconnection between the first package substrate and the second substrate is by wire bonds between wire bond sites in a marginal area on the land side of the first package substrate and peripherally located wire bond sites in a marginal area on the first side of the second substrate.

According to one general aspect of the invention, the second substrate is larger (i.e., wider or longer, or both wider and longer) than the first package substrate, to accommodate the span of the wire bonds. The assembly encapsulation covers whatever area of the first side of the second substrate is not contacted by the spacer or spacer structure, and encloses the z-interconnection wire bonds and wire loops, the edges of the first package, and the marginal area on the land side of the first package. Accordingly, both the land side of the second substrate, and the area of the land side of the first substrate located within the marginal area, are left exposed.

According to another general aspect of the invention, the first substrate is larger (i.e., wider or longer, or both wider and longer) than the second package substrate, to accommodate the span of the wire bonds. In the assembly according to this aspect the encapsulation covers whatever area of the first side of the second substrate is not contacted by the spacer or spacer structure, and encloses the z-interconnection wire bonds and wire loops, the edges of the second package, and the marginal area on the land side of the second package. Accordingly, both the land side of the first substrate, and the area of the land side of the second substrate located within the marginal area, are left exposed.

According to one aspect of the invention, the first package die and the first package substrate, together with the electrical interconnection of the die with the substrate, constitute a package subassembly. In some embodiments the first package includes a ball grid array substrate, and second level interconnection of the package to underlying circuitry, such as a motherboard, is made by solder ball interconnection (or other second level interconnection) at either the exposed part of land side of the first package substrate or at the exposed land side of the second substrate; or, where the first package assembly substrate is larger than the second substrate, second level interconnection of the package to underlying circuitry, such as a motherboard, is made by solder ball interconnection at the land side of the first assembly substrate.

In some embodiments the first package subassembly includes stacked die affixed onto and electrically interconnected with the first assembly substrate. In some embodiments the die in the package is interconnected with the first assembly substrate by wire bonding; or, the die in the package is interconnected with the first assembly substrate by flip chip interconnection.

In preferred embodiments the package subassembly side of the package is the second level interconnect side; that is, second level interconnection of the package to underlying circuitry (such as, for example, a motherboard) is by solder balls (or other means of electrical connection) at lands on the exposed area on the land side of the first package substrate. The exposed land side of the second substrate is, accordingly, available for interconnection with additional components that may be stacked over the assembly. In further aspects, then, the invention features a semiconductor package that has both a second substrate exposed at one side of the package and a portion of a first package substrate exposed at the opposite side of the assembly, and that includes second level interconnections formed at the exposed portion of the first package substrate and interconnection with one or more additional components at the exposed second package substrate. In some embodiments the additional component includes one or more of: a ball grid array (BGA) package, which may be a stacked die BGA; or an additional LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the second substrate.

According to another aspect of the invention, a method for making a semiconductor assembly includes steps of: providing a ball grid array or land grid array substrate, preferably as a strip of ball grid array (BGA) or land grid array (LGA) substrates; mounting die and interconnections onto the BGA or LGA substrate to form the package subassembly; mounting a spacer or spacer assembly upon the package subassembly, for example as a spacer mounted upon the package die and provided with an adhesive on the surface, or as adhesive spacers mounted upon the first package substrate; mounting a second substrate upon the adhesive on the spacer or upon the adhesive spacers; curing the adhesive or adhesive spacers; performing a plasma clean; wire bonding to form z-interconnection between the first side of the second substrate and the land side of the first package substrate; performing a plasma clean; performing a molding operation to enclose the first side of the substrate, the z-interconnection wire bonds and wire loops, the edges of the first package substrate, and the marginal area on the land side of the first package substrate, leaving exposed the second ("land") side of the second substrate and an area of the land side of the first package substrate located within a marginal area; attaching second level interconnect solder balls to sites on the exposed area of the first package substrate; and (where the second substrate was provided in a strip or array) saw singulating to complete the package.

In some embodiments the method further includes affixing and electrically connecting an additional component at the exposed land side of the second substrate. An additional component or components can be mounted upon the assembly as a further step in the manufacture of the stacked package assembly; or, an additional component or components can be mounted upon the assembly at the final product assembly floor.

In the package according to the invention the second substrate can include any of a variety of substrates, so long as the second substrate has wire bond sites exposed at the first side for z-interconnection, and sites exposed at the land side for package testing and/or for interconnection of additional components. A module or assembly having additional components can include any of a variety of LGA packages; the assembly can include wire bonded and/or flip chip packages;

the assembly can include a thermal enhancement feature enabled by one or more heat spreaders in or on the assembly; the assembly can include one or more BGA and/or LGA having more than one die in the package stacked or side by side; the assembly can include electromagnetic shield for one or more of the packages; and the assembly can include any substrate, laminate or build-up or flexible or ceramic, provided that the z-interconnect pads are made available for bonding on peripheral areas of the first package and of the second substrate.

The invention provides for excellent manufacturability, high design flexibility, and low cost to produce a stacked package module having a low profile and a small footprint.

The packages and the modules or assemblies, and the die and substrates and die stacking and interconnection processes, are standard in the industry, providing for selection of the lowest cost and the widest availability. This provides significant flexibility in selecting the components to be stacked and, therefore, in the kinds of functions that can be integrated into the assembly.

A typical single wire-bonded die subassembly, with a spacer over the die (including adhesive), has a thickness about 0.8 mm. The stacking of a second substrate on top of package subassembly according to the invention structure provides a widely useful platform for stacking additional components (packages or die or passive devices). The footprint of the assembly according to the invention can be determined according to the maximum chip size of the stack. The wire bond z-interconnect generally requires that the package subassembly substrate be smaller than the second substrate, by about 0.5 mm to 1.0 mm, to accommodate the wires without shorting to the substrate metal edges. If the selected package subassembly is significantly smaller than the top substrate, wire bonding can accommodate size differences at least up to 8 mm or more. For a given selected package subassembly, accordingly, this allows for selection of a top substrate having a significantly larger footprint than the first package. This provides significant flexibility for the designer, to choose additional components to be stacked over the assembly.

Packages, and modules or assemblies according to the invention can be used for building computers, telecommunications equipment, and consumer and industrial electronics devices.

DETAILED DESCRIPTION

Figure 1:
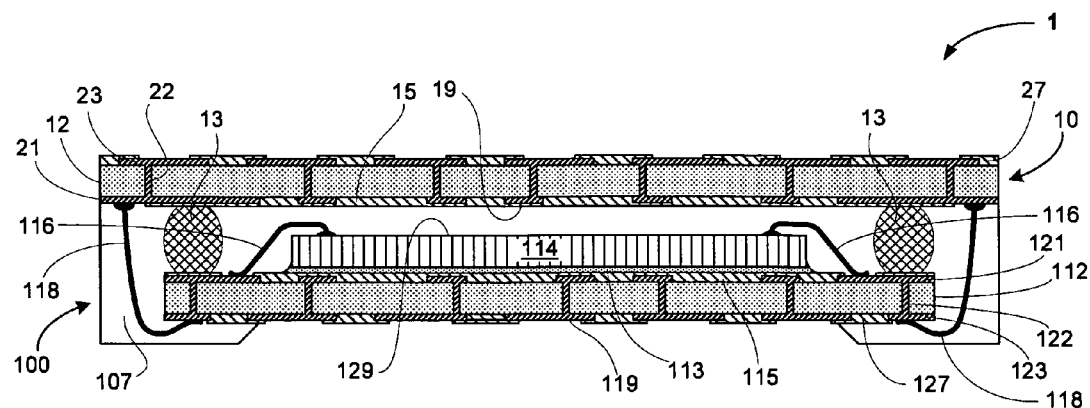
FIG. 1 is a diagrammatic sketch in a sectional view thru an embodiment of a semiconductor package assembly according to an aspect of the invention.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly relabeled, although they are all readily identifiable in all the FIGS.

At some points herein, terms of relative orientation, such as "horizontal", "vertical", "on", "over", "under", "above", "below", "top", "bottom", "upper", "lower", and the like, may be used with reference to the relative orientation of features as shown in the drawings. As will be appreciated, the various assemblies according to the invention may in use or during processing be held in any orientation.

All patents and patent applications referred to herein, above or below, are incorporated by reference.

Turning now to FIG. 1, there is shown in a diagrammatic sectional view generally at 1 an embodiment of a semiconductor package assembly, including a first ("bottom" in FIG. 1) package subassembly and a second ("top" in FIG. 1) substrate stacked over the first package subassembly, in which the package and the second substrate are interconnected by wire bonding, according to an aspect of the invention. In the embodiment shown in FIG. 1, the bottom package subassembly 100 includes a die 114 attached onto a first (bottom) package substrate 112 having at least one metal layer. Any of various substrate types may be used, including for example: a laminate with 2-6 metal layers, or a build up substrate with 4-8 metal layers, or a flexible polyimide tape with 1-2 metal layers, or a ceramic multilayer substrate. The first package substrate 112 shown by way of example in FIG. 1 has two metal layers 121, 123, each patterned to provide appropriate circuitry and connected by way of vias 122. The die is conventionally attached to a surface of the substrate using an adhesive, typically referred to as the die attach epoxy, shown at 113 in FIG. 1 and, in the configuration in FIG. 1, the side of the substrate onto which the die is attached (the "die attach" side) may be referred to as the "upper" side, and the metal layer on that side may be referred to as the "upper" metal layer, although the die attach side need not have any particular orientation in use.

In the bottom package subassembly of FIG. 1 the die is wire bonded onto wire bond sites on the upper metal layer of the substrate to establish electrical connections.

Bonding pads 119 are provided on the lower metal layer 123 of the substrate 112, for second level interconnection of the assembly to the underlying circuitry of, for example, a motherboard (not shown in the FIGS.). Solder masks 115, 127 are patterned over the metal layers 121, 123 to expose the underlying metal at bonding sites for electrical connection, for example the wire bond sites and bonding pads for bonding the wire bonds 116 and solder balls 118.

Referring still to FIG. 1, the second ("top") substrate 10 having a first side and a second side, includes a substrate dielectric 12 and at least one metal layer. Any of various substrate types may be used; the substrate 10 shown by way of example in FIG. 1 has two metal layers 21, 23, each patterned to provide appropriate circuitry and connected by way of vias 22. The side of the second substrate that faces the first package subassembly is referred to as the first side, and the opposite side—the second side or "land" side—faces away from the first package subassembly.

In the second substrate 10 in the embodiment of FIG. 1 solder masks 15, 27 are patterned over the metal layers 21, 23 to expose the underlying metal at bonding sites for electrical connection, for example the wire bond sites for bonding the wire bonds 118.

The second substrate in the example of FIG. 1 is supported by dots or piers 13 mounted on the die side of the first package substrate. The supports 13 may be, for example, filled epoxy bumps, having sufficient height above the first package substrate to hold the second substrate above the package die at a distance great enough to accommodate the loop height of wire bonds 116 over the die 114.

The z-interconnection of the second ("top") substrate 10 and first ("bottom") package subassembly 100 is made by way of wire bonds 118 connecting traces on the downward facing metal layer (the metal layer 21) of the top substrate with traces on the lower metal layer 123 of the bottom package substrate. At one end each wire bond 118 is electrically connected to downward facing surfaces of pads on the metal layer 21 of the top substrate 12, and at the other end each wire bond is connected to lower surfaces of pads on the lower metal layer 123 of the bottom package substrate 112. The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 1 as having been made by forming a bead or bump on the surface of a pad on the lower metal layer of the top substrate, and then drawing the wire toward, and fusing it onto, a pad on the lower metal layer of the bottom substrate. As will be appreciated, the wire bonds can be made in the inverse direction, that is, by forming a bead or bump on the lower surface of a pad on the lower metal layer of the bottom substrate, and then drawing the wire toward, and fusing it onto, a pad on the metal layer of the top substrate. As will be appreciated, selection of a wire bonding strategy for the package-to-package z-interconnection will be determined according to the geometric arrangements of the margins of the stacked substrates and of the bonding surfaces on them. Also, as will be appreciated, in conventional wire bonding equipment the wire bond capillary strikes downward onto upwardly oriented bond pads and, accordingly, the assembly will be inverted according to the invention for the wire bonding procedure at least.

As pointed out above, in embodiments as in FIG. 1 the top substrate is larger than the footprint of the first package subassembly over which it is mounted, leaving an area at the periphery of the first side of the top substrate on which the bond pads are exposed for the wire bonds 118. The top substrate is punch- or saw-singulated.

Bond pads in the upper metal layer at the die attach side of the bottom package substrate are connected to the die by wire bonds, and the upper metal layer is connected to the lower metal layer at the land side of the bottom package substrate through vias to the die attach side of the substrate, and the lower metal layer at the land side of the bottom package substrate is patterned to provide peripherally arranged bond pads for connection with the z-interconnection wires 118.

The structure according to the invention allows for pre-testing of the package before assembly into a module or assembly, to permit rejection of nonconforming packages prior to assembly, and thereby to assure high final module test yields.

In the embodiment of FIG. 1, the z-interconnect pads on the respective substrates are arranged on metal layers near the margins of the substrates. The location and order of the z-interconnect pads are generally arranged so that the z-interconnect pads on the top package substrate approximately overlie the corresponding z-interconnect pads on the bottom package when the packages are stacked. Conveniently, the top substrate 10 has a larger substrate footprint than that of the bottom package 100, to allow clearance for the wire bonds without electrical shorting to the edges of the metal layers of the substrates.

Figure 3:
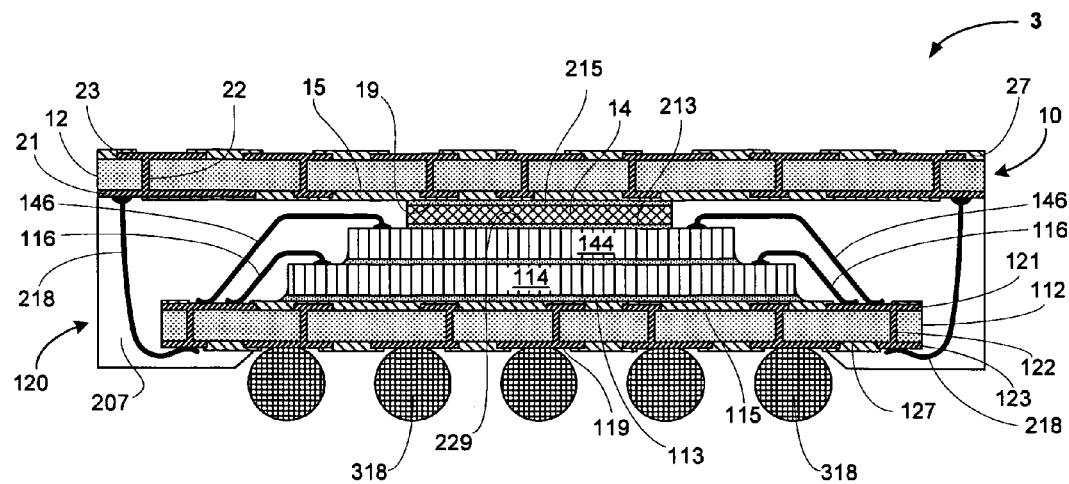
FIG. 3 is a diagrammatic sketch in a sectional view thru an embodiment of a semiconductor package according to another aspect of the invention.

Once the z-interconnect wire bonds have been formed connecting the stacked first package and the second substrate, an assembly encapsulation 107 is formed, to enclose and protect the z-interconnect wire bonds and to provide mechanical integrity to the completed assembly. The assembly encapsulation 107 covers the area of the downward-facing first side of the second substrate that is not contacted by the supports, and encloses the z-interconnection wire bonds and wire loops and the vertical walls and edges of the bottom package, and covers the marginal area of the land side of the bottom package substrate including the wire loops and the wire bond pads to which the wire bonds are connected. This leaves an area of the land side of the bottom package substrate exposed for second-level interconnection. Stated another way, a cavity is formed in the assembly encapsulation on the first package side, leaving an inboard area of the land side of the second package substrate exposed (unencapsulated). Referring to FIG. 3, solder balls 318 are reflowed onto bonding pads 119 on the lower metal layer of the substrate to provide interconnection to underlying circuitry of, for example, a motherboard (not shown in the FIGS.) of a final product, such as a computer. As described in further detail below, additional packages or die can be mounted upon and electrically connected with the land side of the second package substrate.

As shown by way of example in FIGS. 1 and 3, the package may be saw-singulated; alternatively, the module may be individually molded rather than saw-singulated.

As may be appreciated, the first package subassembly may have flip chip, rather than wire bonding, interconnection of the die to the first package substrate. And, in some embodiments, the support for the second substrate can be a spacer mounted upon the first package subassembly die.

Figure 2:
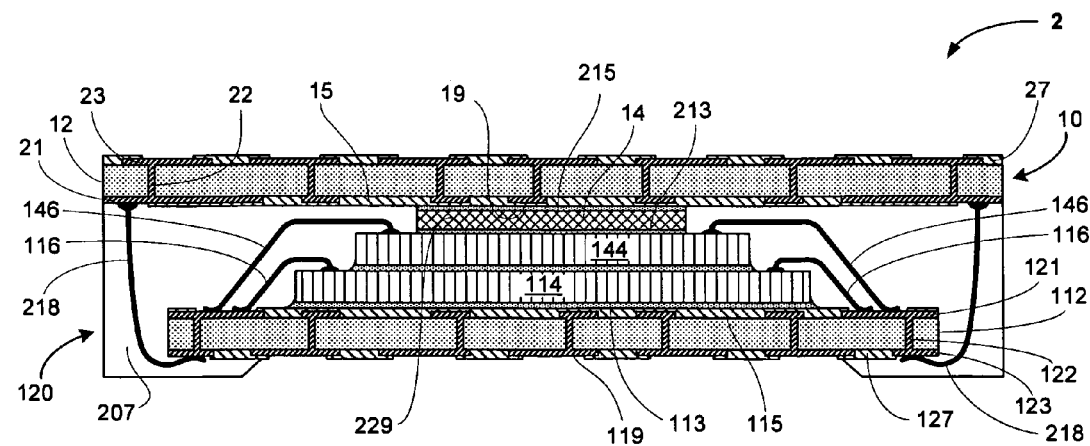
FIG. 2 is a diagrammatic sketch in a sectional view thru an embodiment of a semiconductor package assembly according to another aspect of the invention.

The first package may be a stacked die package. FIG. 2 shows, by way of example, a semiconductor package assembly 2 generally as in FIG. 1, except that in the example of FIG. 2 the bottom package subassembly has stacked die mounted onto and electrically interconnected with the package substrate, having two wire bonded die. Referring now to FIG. 2, in the package subassembly 120 a first die 114 is attached using an adhesive to the (upward facing in the FIG.) die attach side of substrate 112 and a second die 144 is attached using an adhesive to the (upward facing) die attach side of the first die 114. The first die 114 and the second die 144 are electrically connected by wire bonds 116, 146, respectively, to bond sites in the upper metal layer 121.

In the example of FIG. 2, the second substrate 10 is substantially the same as the second substrate 10 of FIG. 1. In the package assembly 2 a spacer 14 (which may be, for example, a "dummy" die, or silicon or glass chip) is mounted upon the uppermost stacked die 144 using an adhesive 213 and the second substrate 10 is affixed over the spacer 14 using an adhesive 215 at the surface of the spacer 14. Thus, the downward facing surface 19 of the second substrate rests upon the adhesive 215, and the thickness of the spacer 14, plus the thicknesses of the adhesives 213 and 215 is selected to be great enough to accommodate the loop height of the wire bonds 146.

Other spacers or spacer constructs may be employed according to the invention. For example, the spacer 14 may be an adhesive spacer, made up of a curable adhesive filed with polymer spheres having a diameter sufficient to provide the desired separation between the upward-facing surface 229 of the die 144 and the downward-facing surface 19 of the substrate 10.

In other embodiments, where the footprint of the second die is such that the second die cannot be stacked upon the first die without interfering with the wire bonds (where, for example, the second die is the same size as, or larger than, the first die), a spacer can be mounted upon the first die, and the second die can be mounted upon the spacer.

The first die in the first package subassembly may have flip chip, rather than wire bonding, interconnection of the die to the first package substrate; the second die can be mounted upon the (upward-facing) backside of the first (flip chip) die, and wire bonded to bond pads in the upper metal layer of the first package substrate, generally as described above.

The z-interconnection wire bonds 218 are formed generally as described for the z-interconnect wire bonds 118 in FIG. 1. Once the z-interconnect wire bonds have been formed connecting the stacked first package and the second substrate, an assembly encapsulation 207 is formed, to enclose and protect the z-interconnect wire bonds and to provide mechanical integrity to the completed assembly. The assembly encapsulation 207 covers the marginal area of the downward-facing first side of the second substrate, and encloses the z-interconnection wire bonds and wire loops and the vertical walls and edges of the bottom package, and covers the marginal area of the land side of the bottom package substrate including the wire loops and the wire bond pads to which the wire bonds are connected. This leaves an area of the land side of the bottom package substrate exposed for second-level interconnection. Solder balls 318 are reflowed onto bonding pads 119 on the lower metal layer of the exposed lower package substrate to provide interconnection to underlying circuitry of, for example, a motherboard (not shown in the FIGS.) of a final product, such as a computer, as shown by way of example in FIG. 3.

In an alternative embodiment, the exposed side of the second substrate provides for second-level interconnection. By way of example, the embodiment shown in FIG. 4 has second level interconnect solder balls 418 mounted onto pads 419 on the metal layer 23, for connection of the package assembly to underlying circuitry such as a motherboard. In embodiments such as these, the exposed portion of the first package substrate is available for stacking additional components such as packages, die, or passive devices. However, the exposed portion of the first package substrate has a more limited area than the second package substrate, limiting the number of interconnections that can be made at the first package side. Moreover, the part of the assembly molding 207 that covers the marginal area of the land side of the land side of the first package substrate must be thick enough to accommodate the loop height of the wire bonds 218 (plus a tolerance). Typically the thickness of the molding at the wire loops is in the range about 50 um to about 200 um. Where reverse wire bonding is employed, so that an end of the wire loop is stitched onto the pads on the land side of the first package, the wire loop height in practice may be as little as about 35 um and, accordingly, a molding thickness over the marginal area of as little as about 100 um can be achieved in such embodiments. A greater mold height will be required where forward wire bonding is employed, as the wire loop height over a ball (or bump) as more usually about 100 um or greater using currently available wire bonding techniques forming wire having about 1 mil thickness.

This in effect raises a low wall around the exposed region of the first package substrate, and this can limit the dimensions and configuration of devices that may be stacked upon the land side of the first package substrate. Embodiments as shown for example in FIG. 3, in which the second level interconnection is made at the exposed region of the land side of the first package substrate, permit stacking of much larger additional components over the assembly, as shown in FIGS. 7B and 8B, for example.

Figure 5A:
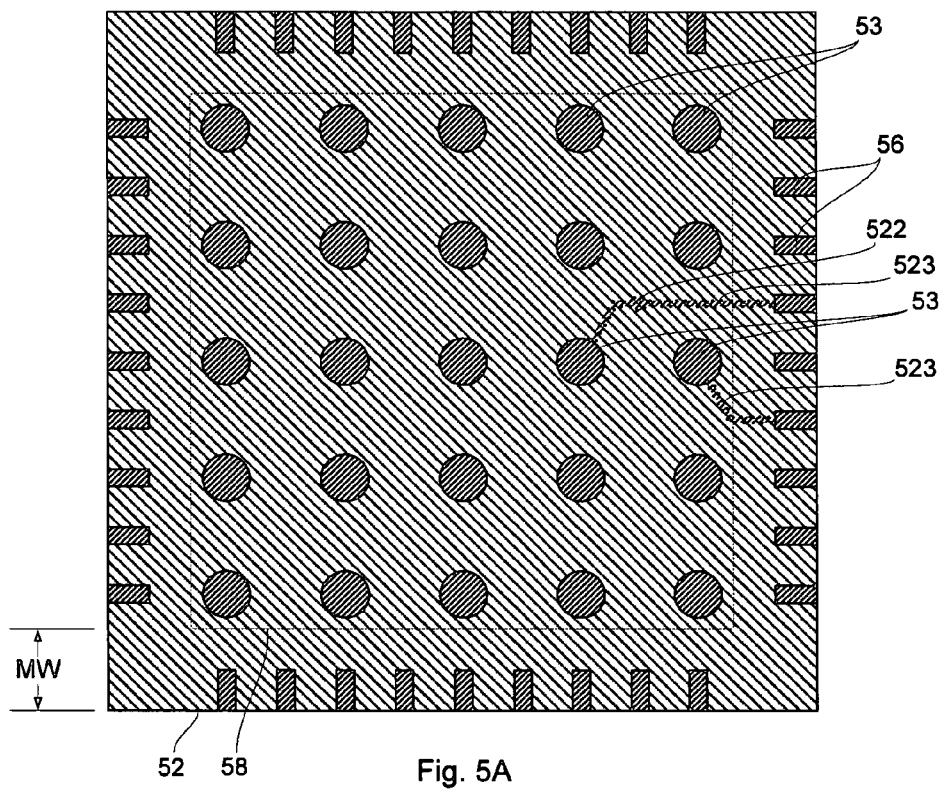
FIG. 5A is a diagrammatic sketch in a plan view showing the land side of a first package substrate according to an embodiment of the invention in an arrangement suitable for use in an embodiment of the invention as shown in FIG. 3.
Figure 5B:
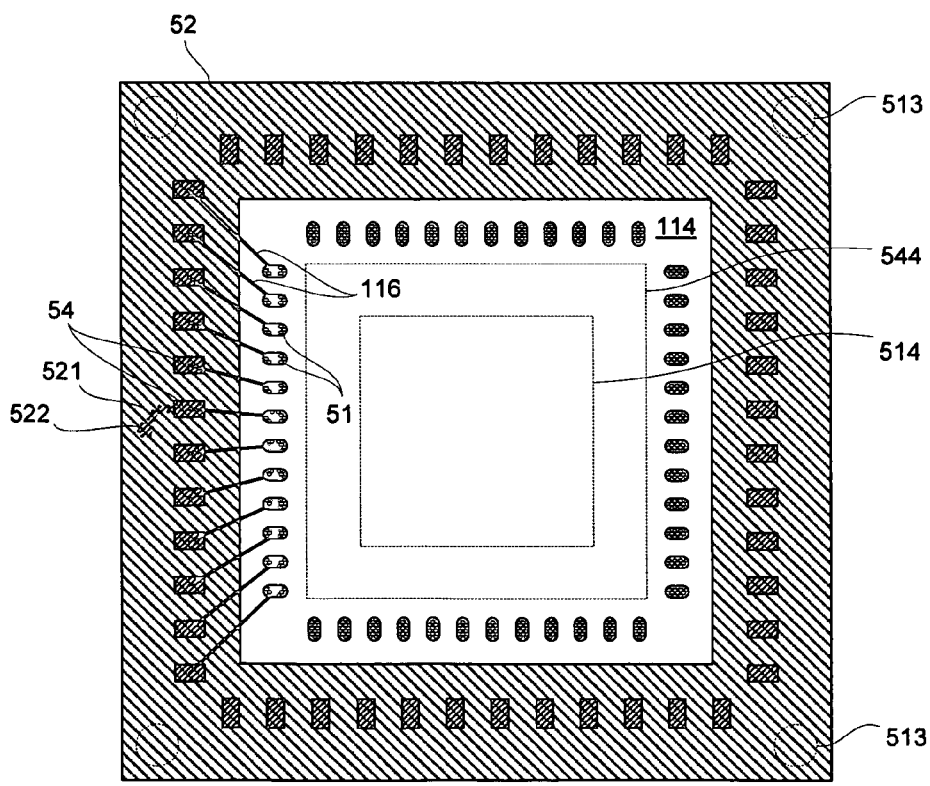
FIG. 5B is a diagrammatic sketch in a plan view showing the die attach side, with die attached, of a first package substrate according to an embodiment of the invention in an arrangement suitable for use in an embodiment of the invention as shown in FIG. 3.

FIGS. 5A and 5B are diagrammatic sketches in plan view showing the land side and the die attach side, respectively, of a suitable first package substrate as illustrated at 112 in FIG. 2. Referring to FIG. 5A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 53) arrayed in a middle region of the substrate surface, and bond fingers (e.g., 56), arranged in a marginal area near the edge 52 of the substrate. Obscured by the solder mask are traces (e.g., 523) in the metal layer which variously connect the ball pads 53 and the bond fingers 56, and/or connect ball pads 53 with vias (e.g., 522) which electrically connect traces in the patterned metal layer at the land side of the substrate with traces in the patterned metal layer at the die attach side of the substrate.

As described above, the assembly encapsulation covers the bond pads 56 and the wire loops formed at the pads 56; the encapsulation is limited at the land side of the substrate to a marginal area, indicated in FIG. 5A by the broken line 58, so the region of the land side of the first package substrate bounded by the marginal encapsulation, that is, within the broken line 58, is left exposed following formation of the assembly molding. Accordingly, the ball pads 53 are available for attachment of additional devices (as illustrated for example in FIG. 4) or for z-level interconnection of the assembly to underlying circuitry (as illustrated for example in FIG. 3). The ball pads 53 are additionally available as test probe sites for testing the package prior to assembly, or for testing the package assembly, if desired, prior to mounting the second level interconnect solder balls. The encapsulated marginal area has a width (MW in FIG. 5A) determined by the sum of the lengths of the bond fingers, the length of the trace to the bond finger, and the width of the saw street. Additionally, some mold flash may appear on the substrate surface at the inner edge of the margin (at the broken line 58 in FIG. 5A). Where the substrate is provided as one in a strip or array, some substrate material at the edge is lost to the saw width during saw singulation of the first package. Typically the bond finger length is about 250 um, the finger trace length is about 50 um, and an allowance for mold resin bleed can be about 500 um. The saw typically consumes about 50 um.

As a practical matter the number and arrangement of the ball pads 53 depend upon the nominal ball diameter, as the balls must not contact each other, or be too close together, when collapsed. Also as a practical matter the size and proximity of the ball pads 53 are limited by limits of resolution in fabricating the traces and, particularly, the solder mask openings. In a typical example the ball pads are generally circular with a diameter about 280 um, and are arranged in a square or rectangular array at a center-to-center distance about 500 um. (The distance between nearest edges of adjacent solder mask openings is typically not less than about 0.20 times the center-to-center distance.)

The die attach side of the first package substrate, with die attached, is illustrated in FIG. 5B. The first die 114 is affixed, active side upward, onto the die attach side of the substrate. In this example, the die has four edges defining a square. Wire bond pads 51 are arranged in rows near the four edges of the die. As on the land side of the substrate, most of the surface of the die attach side is covered by a solder mask, except where sites on the metal layer are revealed by openings in the solder mask, including particularly rows (one row along each edge of the die, in this example) of bond fingers (e.g., 54). Wires 116 connect the die pads 51 with the bond fingers 54. Obscured by the solder mask are traces (e.g., 521) in the metal layer connecting bond fingers 54 to vias (e.g., 522) which electrically connect traces in the patterned metal layer at the die attach side of the substrate with traces in the patterned metal layer at the land side. Accordingly, the first package die is connected by way of the wires to traces in the metal layer on the die attach side of the first package substrate, and by way of vias to traces and to z-interconnect wire bond fingers in the metal layer on the land side. The z-interconnect wires connect the bond fingers on the land side of the first package substrate to bond fingers on the die attach side of the second package substrate. The footprint of the second die 144 is indicated in FIG. 5B by the broken line 544. The footprint of a spacer 14 is indicated in FIG. 5B by the broken line 514; alternatively, where spacers 13 on the first substrate are employed rather than a spacer 14 mounted upon the second die, their location is indicated by way of example by the broken lines 513, for example. The second die and the wire bonds 146, and the spacer 14, or alternatively the spacers 13, are omitted from FIG. 5B for simplicity.

Figure 6A:
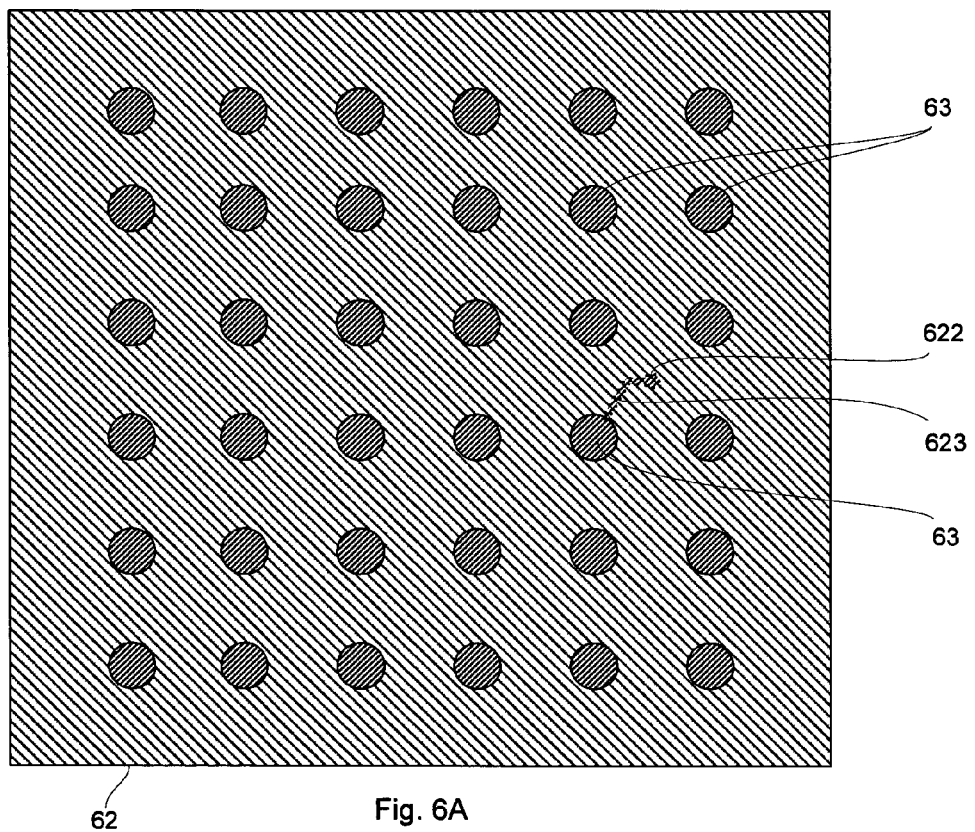
FIG. 6A is a diagrammatic sketch in a plan view showing the land side of a second substrate according to an embodiment of the invention in an arrangement suitable for use in an embodiment of the invention as shown in FIG. 3.
Figure 6B:
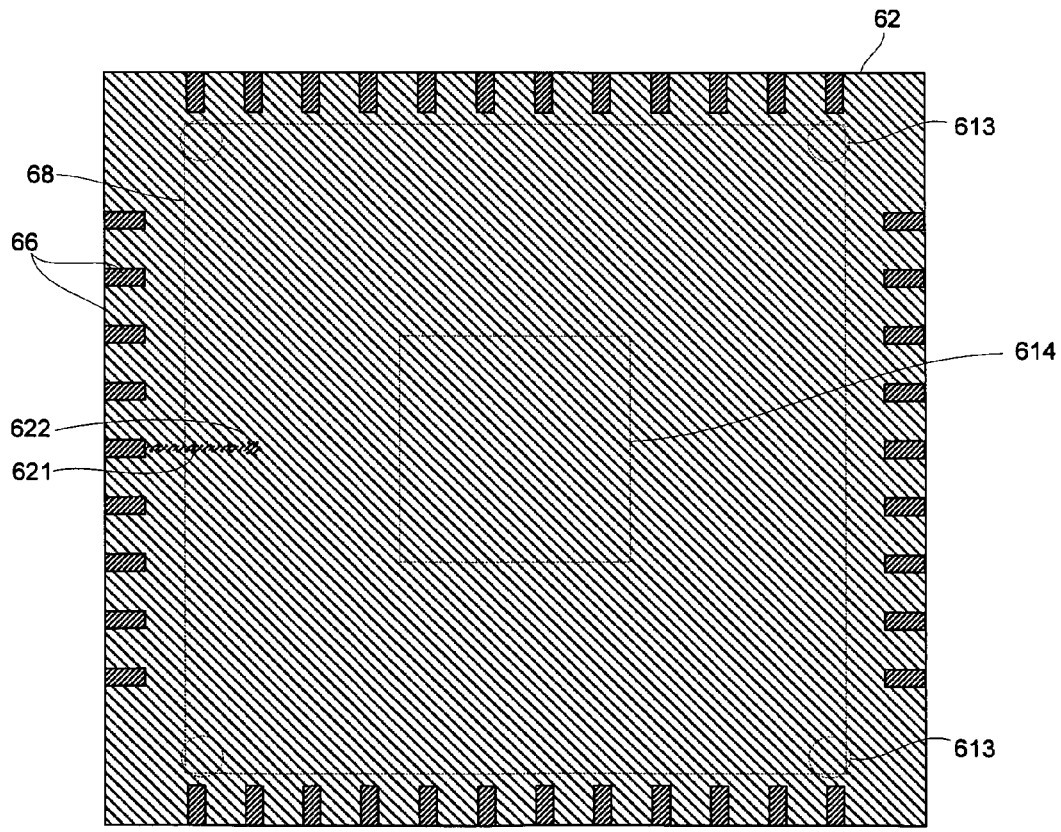
FIG. 6B is a diagrammatic sketch in a plan view showing the first side of a second substrate according to an embodiment of the invention in an arrangement suitable for use in an embodiment of the invention as shown in FIG. 3.

FIGS. 6A and 6B are diagrammatic sketches in plan view showing the second side and the first side, respectively, of a suitable second substrate as illustrated at 10 in FIG. 1. Referring to FIG. 6A, most of the surface of the-land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 63) arrayed in a middle region of the substrate surface. Obscured by the solder mask are traces (e.g., 623) in the metal layer which connect the ball pads 63 to vias (e.g., 622) which electrically connect traces in the patterned metal layer at the land side of the substrate with traces in the patterned metal layer at the first side of the substrate.

As described above, the land side of the second substrate is left entirely exposed following assembly encapsulation. Accordingly, the view of the second substrate in FIG. 6A is substantially a view of a surface of the assembly. Accordingly, the ball pads 63 are available for second-level interconnection of the assembly to underlying circuitry (as illustrated for example in FIG. 4) or, more preferably, for attachment of additional devices (as illustrated for example in FIG. 3). The ball pads 63 are additionally available as test probe sites for testing the package prior to assembly, and for testing the package assembly, if desired, prior to mounting the second level interconnect solder balls.

Optionally, and in some applications preferably, the ball attach pads on the land side of the second substrate may be employed to facilitate testing of the assembly using a conventional test socket. Such testing of the assembly can be carried out, for example, following attachment of the second substrate as a top substrate, but prior to formation of the overall assembly molding, or prior to z-interconnect wire-bonding. Testing, facilitated according to the constructs of the invention, at any of various stages in manufacture, can significantly reduce the likelihood of further processing of components that do not meet specifications.

The first side of the second substrate is illustrated in FIG. 6B. As on the land side of the second substrate, most of the surface of the first side is covered by a solder mask, except where sites on the metal layer are revealed by openings in the solder mask, including particularly z-interconnect bond fingers (e.g., 66) arranged in a marginal area near the edge 62 of the substrate. Obscured by the solder mask are traces (e.g., 621) in the metal layer connecting vias (e.g., 622) which electrically connect traces in the patterned metal layer at the first side of the substrate with traces in the patterned metal layer at the land side, to z-interconnect bond fingers 66.

The second substrate z-interconnect pads (bond fingers) 66 are formed by patterning regions of the metal layer situated at the margin on the first side of the second package substrate 12. The margin extends beyond the footprint of the first substrate 112; this footprint is indicated by the broken line 68 in FIG. 6B. The width of the margin can be less than about 1 mm, and, in order to provide adequate clearance for the wire bonding the width of the margin may preferably be greater than about 0.2 mm. Nominally in some embodiments the margin is about 0.5 mm. The footprint of the spacer 14 on the downward-facing first side of the second substrate is shown by the broken line 614 in FIG. 6B; or, alternatively, the contact points of the spacers 13 on the downward-facing first side of the second substrate is shown by the broken lines 613, for example, in FIG. 6B.

As noted above, z-interconnect bond fingers at the first side of the second substrate are connected by traces in the metal layer on first side of the first package substrate by way of vias to traces and to z-interconnect wire bond fingers in the metal layer on the land side, where interconnection of the package is made to additional devices stacked over the assembly or to an underlying substrate (second level interconnection). The z-interconnect wires connect the bond fingers on the first side of the second substrate to bond fingers on the land side of the first package substrate, and the package die are interconnected as appropriate by way of the traces, wires, and vias to the pads on the land sides of the first package substrate, where interconnection of the package assembly is made to an underlying substrate (second level interconnection) or to additional devices stacked over the assembly. In this way the die in the first package subassembly are interconnected as desired to exposed pads on the land sides of the first package substrate and the second substrate at the top and bottom of the completed assembly.

As suggested in the FIGS., the second substrate necessarily has a larger footprint than the first package substrate, to accommodate the z-interconnection between the substrates. In the examples shown, z-interconnects are arranged along all four edges of the packages and, accordingly, the second package is both wider and longer than the first package. As may be appreciated, in some assemblies according to the invention, z-interconnection may be made between bond fingers on fewer than all four edges, as for example along only one edge, or along two opposite edges. In such embodiments (unless a larger die in the second substrate requires a larger footprint), the second substrate need be larger (longer or wider) than the first package only in one direction.

The package may have any of a variety of functionalities. For example, the first package subassembly can include a DSP, ASIC, GPU; or, the first package subassembly can include a memory, such as Flash, DRAM, SRAM.

The processor chip in a flip chip package subassembly according to this aspect of the invention can be, for example, an ASIC, or a GPU, or a CPU, often an ASIC. Where the package subassembly is memory it can include stacked memory die. A shielded flip chip die-down package subassembly can be particularly suitable for higher speed applications, particularly for RF frequency processing, as in mobile communications applications.

In still other configurations according to the invention, an additional device, such as a package or die, is attached to the package assembly on an available (exposed) substrate surface, and in some embodiments on the exposed land side of the second package substrate. That is, the assembly as illustrated for example in FIG. 3 or 4 can serve as a platform for construction of a variety of stacked package modules.

In such embodiments the assembly as shown for example in FIG. 1 or 2 can provide a useful platform upon which to stack components having additional functionalities, as shown for example in FIGS. 7A through 13. Because the second substrate is fully exposed, it can accommodate any of a variety of component (die or package) configurations and-sizes, and all that is required for compatibility of the package assembly with the components is that the traces on the exposed second substrate be suitably routed to accept the additional component.

Figure 7A:
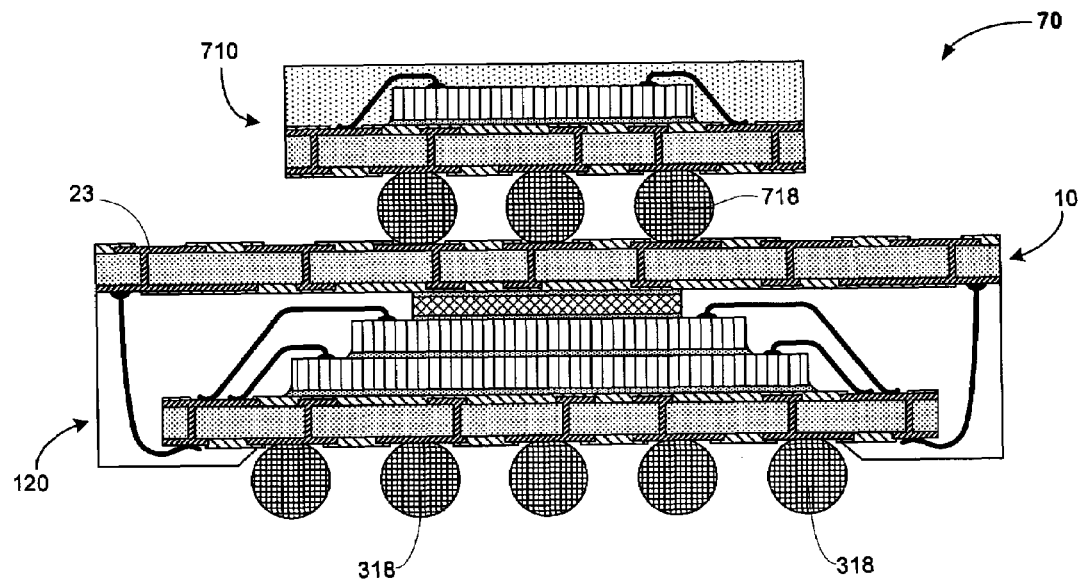
FIGS. 7A and 7B are diagrammatic sketches in a sectional view thru a semiconductor assembly according to embodiments of the invention, each including a BGA stacked over the assembly.
Figure 7B:
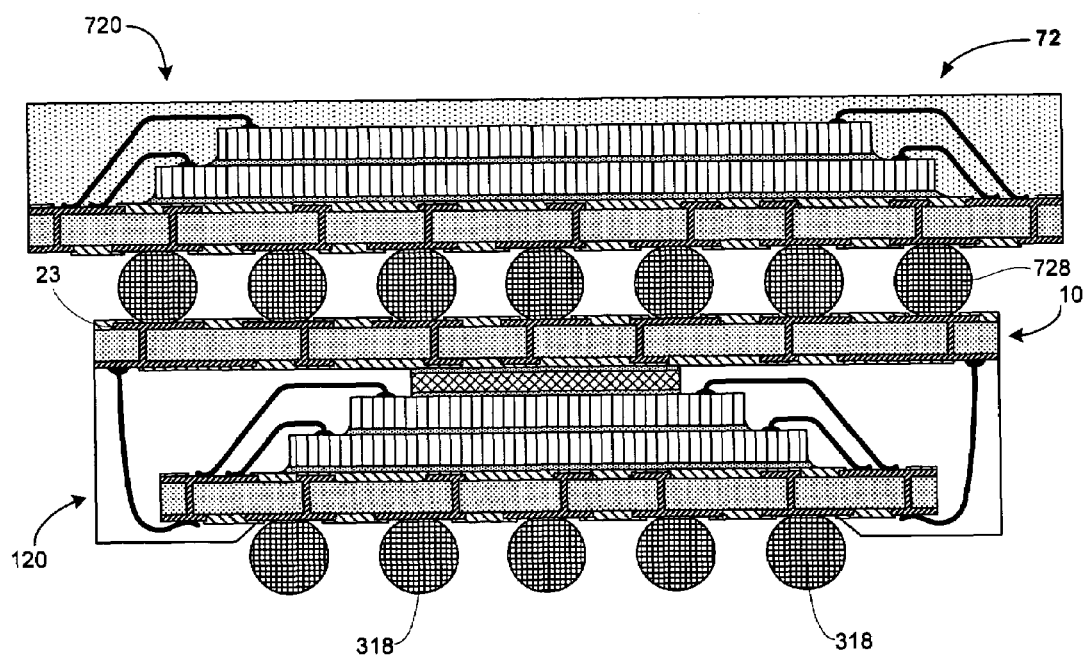

For example, as shown in FIGS. 7A and 7B a ball grid array (BGA) package can be mounted over a package assembly constructed as described above with reference to FIG. 3. In FIG. 7A, a BGA package 710 having interconnect solder balls 718 is aligned with and mounted upon the land side of a second substrate 10, and the solder balls are reflowed onto ball pads in the metal layer 23 to form a module 70. Here the BGA footprint is smaller than that of the package assembly; in the module 72 shown in FIG. 7B, the footprint of the BGA 720 is larger than that of the package assembly, and the ball array has more interconnect solder balls 728, which accordingly occupy more ball pads on the second package substrate 10. Also, in the example of FIG. 7B, the BGA is a stacked die package, while in FIG. 7A the BGA is a single die package.

Figure 8A:
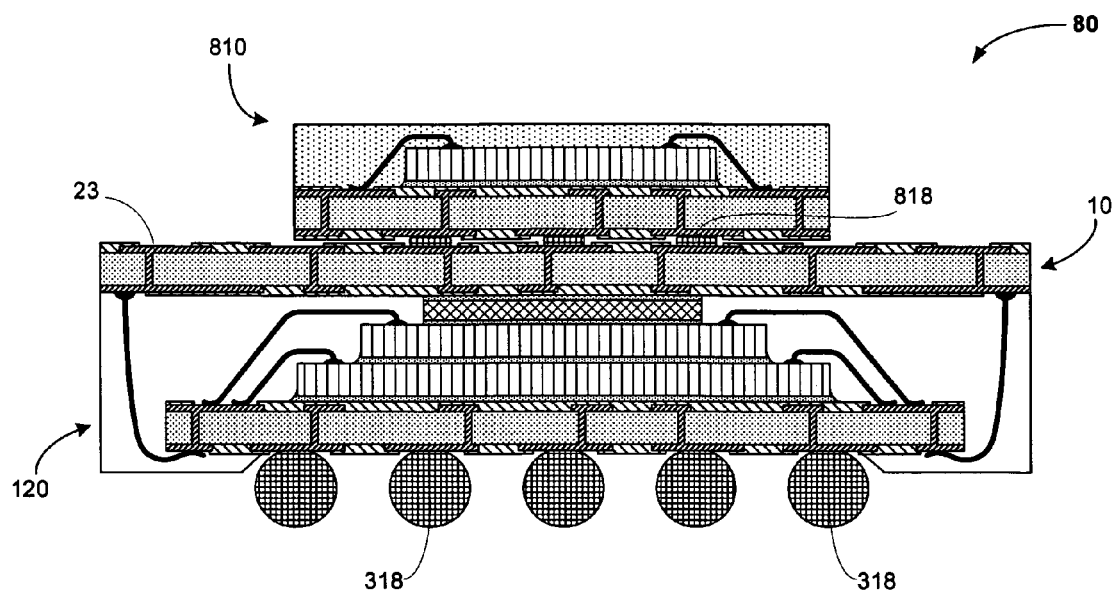
FIGS. 8A and 8B are diagrammatic sketches in a sectional view thru a semiconductor assembly according to embodiments of the invention, each including a LGA stacked over the assembly.
Figure 8B:
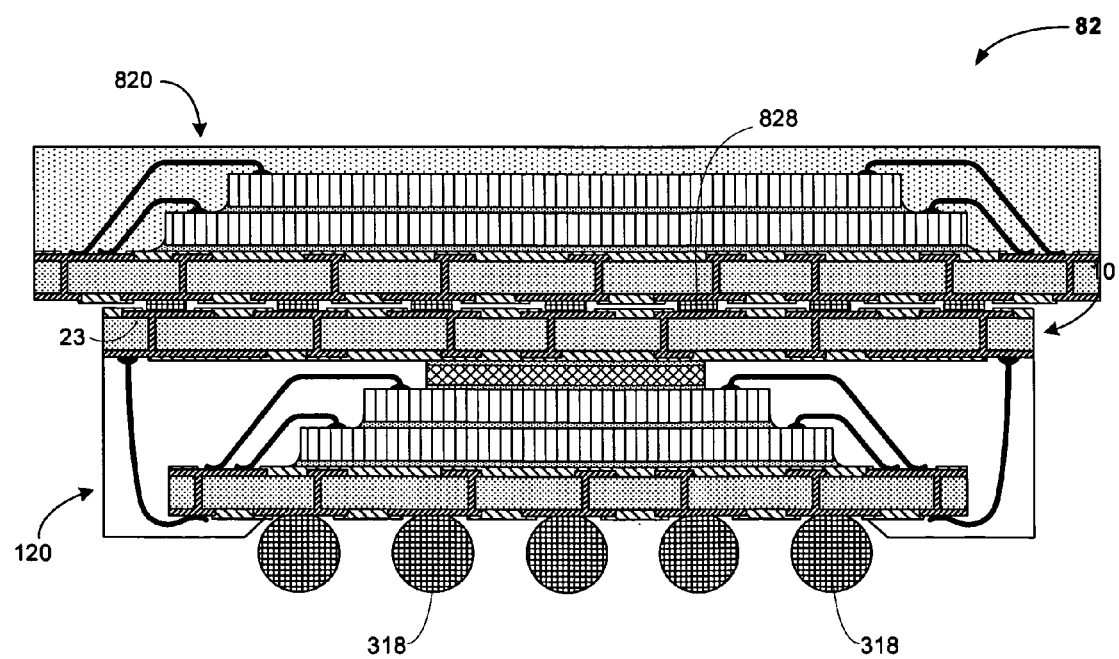

And for example, as shown in FIGS. 8A and 8B an additional land grid array (LGA) package can be mounted over a package assembly constructed as described above with reference to FIG. 3. In FIG. 8A, a LGA package 810 having land interconnects 818 is aligned with and mounted upon the land side of a second package substrate 10, and the land interconnects are reflowed onto pads in the metal layer 23 to form a module 80. Here the LGA footprint is smaller than that of the package assembly; in the module 82 shown in FIG. 8B, the footprint of the LGA 820 is larger than that of the package assembly, and the array has more land interconnects 828, which accordingly occupy more pads on the second package substrate 10. Also, in the example of FIG. 8B, the LGA is a stacked die package, while in FIG. 8A the LGA is a single die package.

A configuration having a larger additional package mounted over the package assembly as shown in FIGS. 7A and 8A may, for example, include processors in the first package 10, and a memory package as the additional package 720 or 820. The minimum sizes of footprints of the package subassembly 120 and of the second substrate 10 in the assembly are determined principally by the dimensions of the die in the first package, and this generally relates to the functionality of the die. ASICs may be comparatively very small, for example, and different processors may be of significantly different sizes. Memory die, on the other hand, may be comparatively large. A digital signal processor (DSP) package, for example, has a footprint typically in the range 12×12 mm to 16×16 mm. A memory package, on the other hand, for example, typically has a footprint in the range 8×10 mm to 18×18 mm. Accordingly, if the assembly as in FIG. 3 includes a DSP in the first package subassembly 10, establishing a footprint of 16×16 mm for the assembly 3, the manufacturer may according to the specifications of the customer select either a smaller LGA memory package (e.g. 810 in FIG. 8A, giving a module 80) or a larger LGA memory package (e.g. 820 in FIG. 8B, giving a module 82). Thus, for embodiments as in FIGS. 7A, 7B, 8A, 8B, the manufacturer can mix-and-match platforms with selected memory BGAs or LGAs according to function (memory capacity and speed; memory type) and according to costs from various suppliers.

Figure 9:
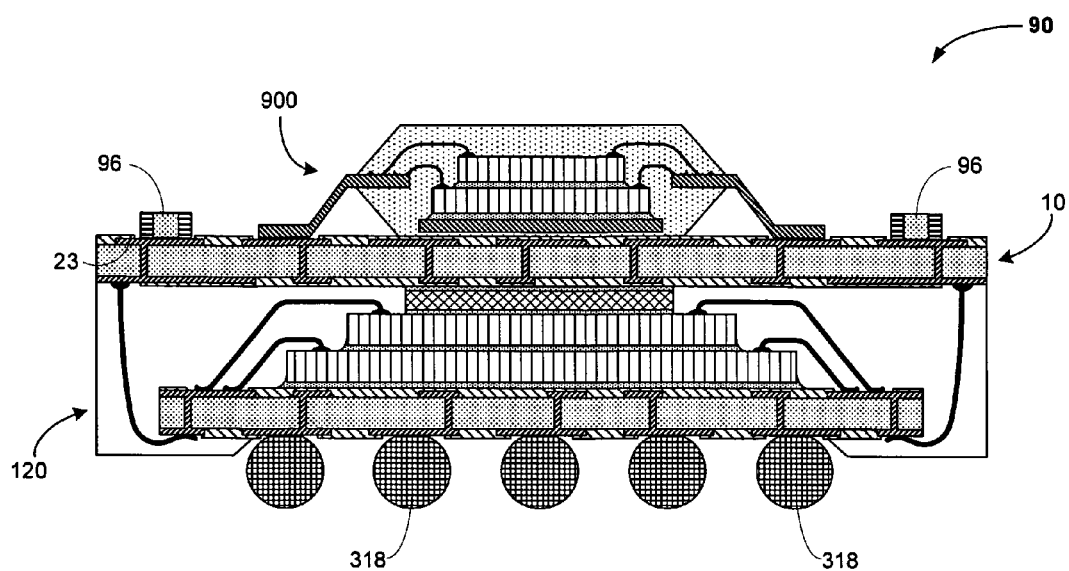
FIG. 9 is a diagrammatic sketch in a sectional view thru a semiconductor assembly according to an embodiment of the invention, including a SD QFP stacked over the assembly.
Figure 10:
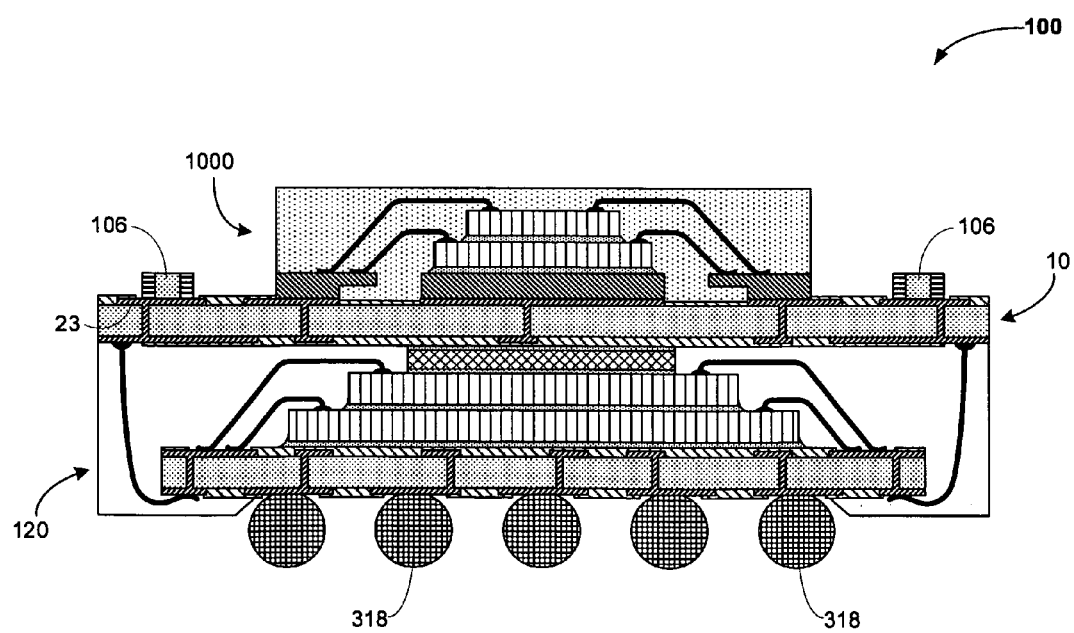
FIG. 10 is a diagrammatic sketch in a sectional view thru a semiconductor assembly according to an embodiment of the invention, including a SD QFN/LFCSP stacked over the assembly.
Figure 11:
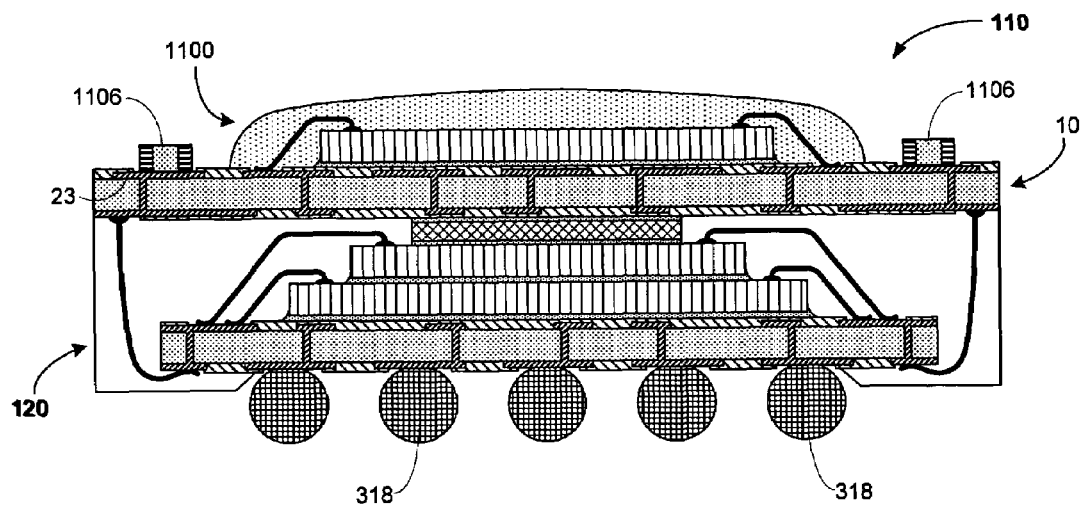
FIG. 11 is a diagrammatic sketch in a sectional view thru a semiconductor assembly according to an embodiment of the invention, including a wire bonded die stacked over the assembly.
Figure 12:
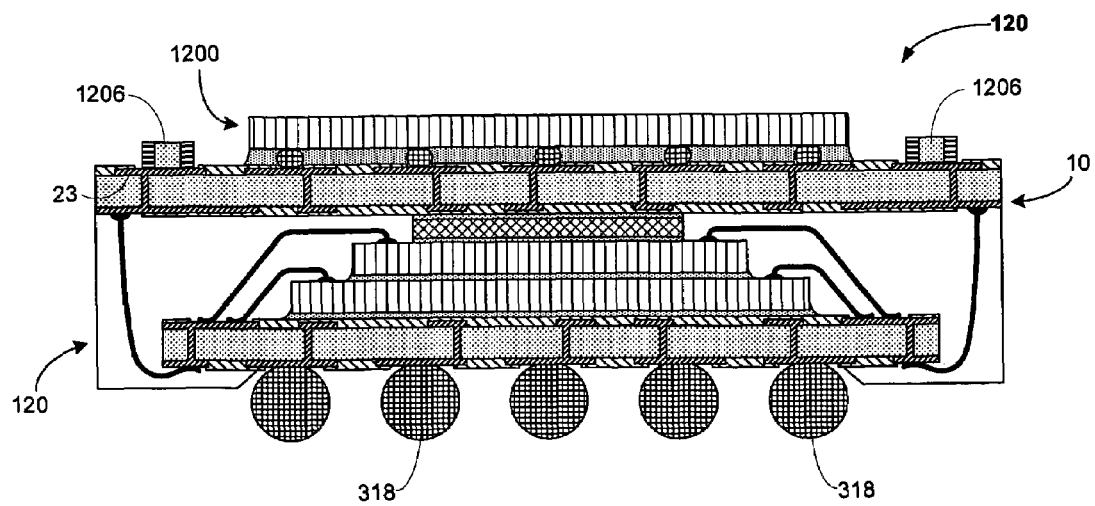
FIG. 12 is a diagrammatic sketch in a sectional view thru a semiconductor assembly according to an embodiment of the invention, including a flip chip die stacked over the assembly.
Figure 13:
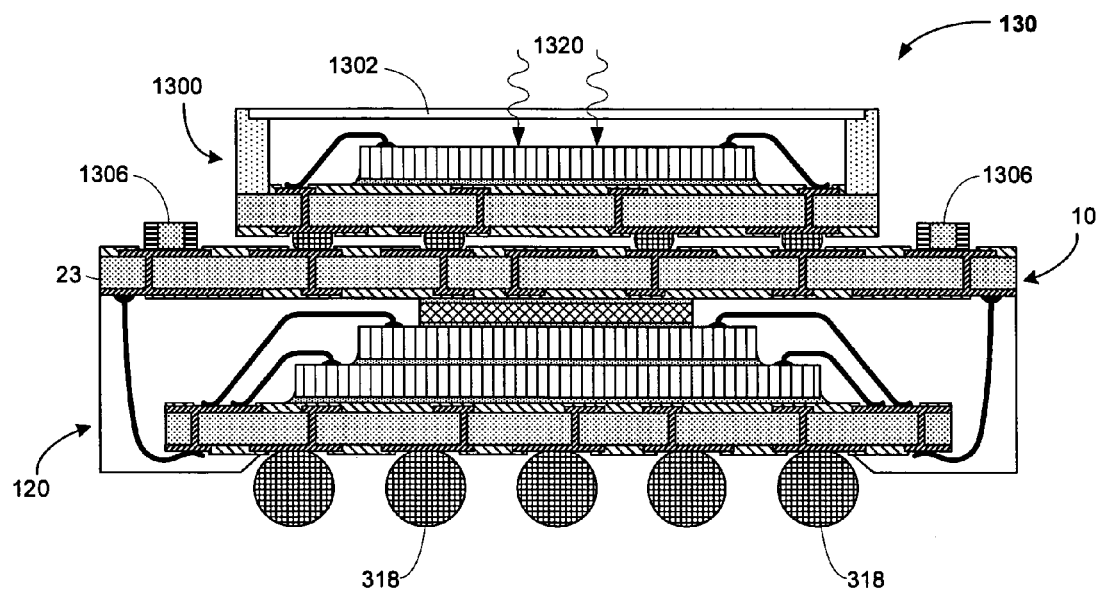
FIG. 13 is a diagrammatic sketch in a sectional view thru a semiconductor assembly according to an embodiment of the invention, including an optical sensor package stacked over the assembly.

Other additional components or devices can be mounted over the package assembly, requiring only that the land side of the second substrate be suitably routed to accept electrical interconnections from the component. FIG. 9 shows a module 90 having a stacked die quad flat package 900, accompanied by passive devices 96, mounted over a package assembly constructed generally as in FIG. 3. FIG. 10 shows a module 100 having a stacked die quad flat nonleaded lead frame chip scale package 1000, accompanied by passive devices 106, mounted over a semiconductor package assembly constructed generally as in FIG. 3. FIG. 11 shows a module 110 having a wire bonded die 1100, accompanied by passive devices 1106, mounted over a semiconductor assembly constructed generally as in FIG. 3; the die and wires are covered by a so-called "glop top" encapsulation, formed by syringe dispensing an encapsulating resin. FIG. 12 shows a module 120 having a flip chip mounted die 1200, accompanied by passive devices 1206, mounted over a semiconductor package assembly constructed generally as in FIG. 3; an underfill protects the flip chip interconnects. FIG. 13 shows a module 130 having an optical sensor package 1300, which may be an image forming device, accompanied by passive devices 1306, mounted over a semiconductor package assembly constructed generally as in FIG. 3; light passes through a transparent cover or lens as indicated by arrows 1320 to reach the active side of the wire-bonded light sensor die.

Figure 14:
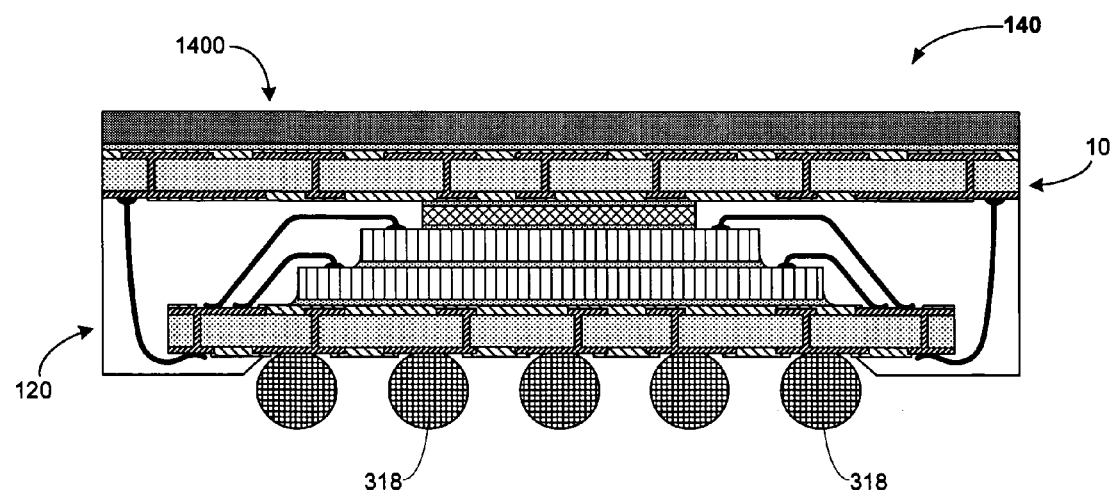
FIG. 14 is a diagrammatic sketch in a sectional view thru a semiconductor assembly according to an embodiment of the invention, including a heat spreader stacked over the assembly.

FIG. 14 shows an assembly 140, including a semiconductor package assembly generally as shown in FIG. 3, having a heat spreader 1400 mounted upon the land side of the second package substrate.

Figure 4:
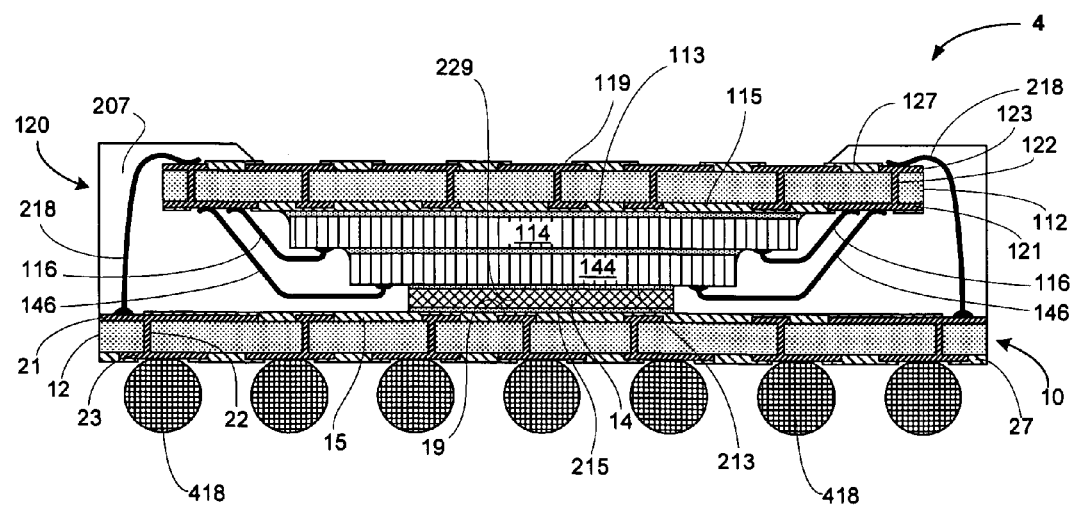
FIG. 4 is a diagrammatic sketch in a sectional view thru an embodiment of a semiconductor package according to another aspect of the invention.
Figure 24:
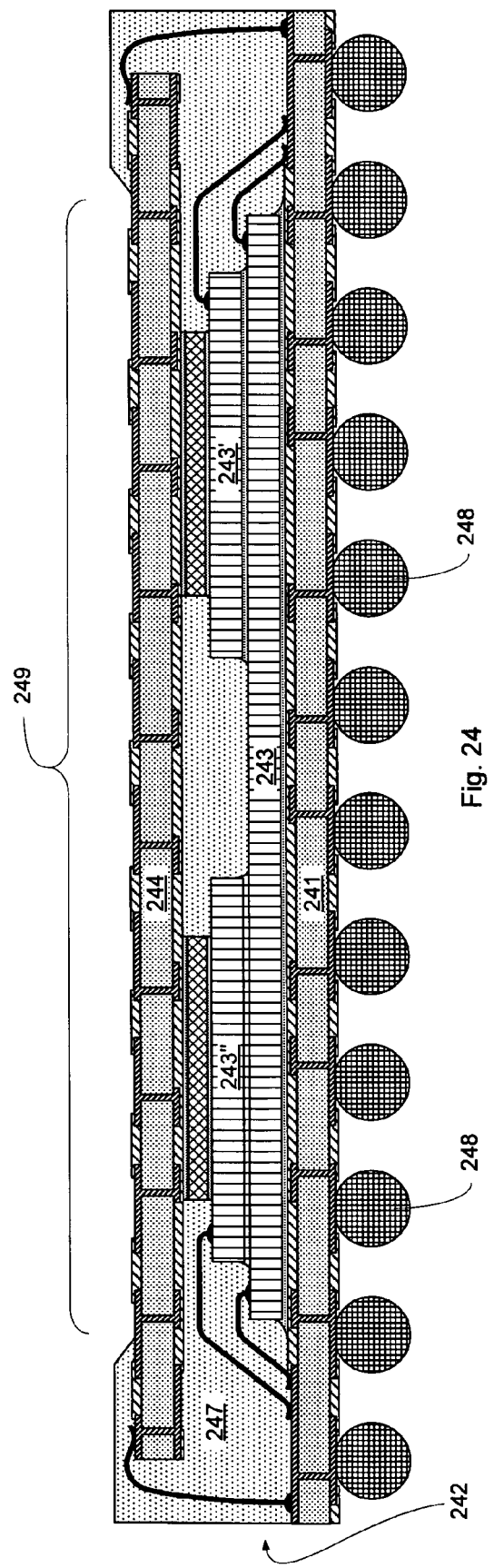
FIG. 24 is a diagrammatic sketch in a sectional view thru an embodiment of a semiconductor package assembly according to another aspect of the invention.

In another aspect, illustrated for example in FIG. 24, the first package subassembly substrate (that is, the substrate in the assembly upon which the enclosed die is/are mounted, has a larger footprint than the second substrate (compare FIG. 24 with FIGS. 3 and 4).

In the example of FIG. 24, a first package subassembly 242 includes die mounted upon (die 243) and stacked over (die 243', 243") a first package subassembly substrate 241.

In the stacked package assembly of FIG. 24 a spacer (which may be, for example, a "dummy" die, or silicon or glass chip) is mounted upon the uppermost stacked die 243', 243" using an adhesive and a second substrate 244 (which may be referred to as a "core" substrate) is affixed over the spacer using an adhesive at the surface of the spacer. Thus, the downward facing surface of the second substrate rests upon the adhesive on the spacer, and the thickness of the spacer, plus the thicknesses of the adhesives, is selected to be great enough to accommodate the loop height of the wire bonds connecting the die 243', 243" with the first package assembly substrate 241.

Other spacers or spacer constructs may be employed according to the invention, as described for example with reference to FIG. 2. For example, the spacer may be an adhesive spacer, made up of a curable adhesive filed with polymer spheres having a diameter sufficient to provide the desired separation between the upward-facing surface of the die 243', 243" and the downward-facing surface of the substrate 244.

And, in the example of FIG. 24, the z-interconnection of the second ("top") substrate and first ("bottom") package subassembly is made by way of wire bonds connecting traces on the upward facing (die attach side) metal layer of the bottom substrate with traces on the lower (upward-facing, land side) metal layer of the bottom package subassembly substrate. The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 24 as having been made by reverse bonding, by forming a bead or bump on the surface of a pad on the metal layer on the die attach side of the first assembly substrate, and then drawing the wire toward, and fusing it onto, a pad on the metal layer on the land side of the second substrate. As will be appreciated, the wire bonds can be made in the forward direction. As will be appreciated, selection of a wire bonding strategy for the package-to-package z-interconnection will be determined according to the geometric arrangements of the margins of the stacked substrates and of the bonding surfaces on them.

As pointed out above, in embodiments as in FIG. 24 the footprint of the second ("top") substrate is smaller than the footprint of the first package subassembly over which it is mounted, leaving an area at the periphery of the die attach side of the first ("bottom") package assembly substrate on which the bond pads are exposed for the z-interconnect wire bonds. The first package assembly substrate is punch- or saw-singulated.

Bond pads in the upper metal layer at the die attach side of the first package subassembly substrate are connected to the first die 243 and to the second and third die 243', 243" by wire bonds, and the upper metal layer is connected to the lower metal layer at the land side of the first package subassembly substrate through vias to the die attach side of the substrate; and the metal layer at the land side of the second substrate is patterned to provide peripherally arranged bond pads for connection with the z-interconnection wires.

The structure according to the invention allows for pre-testing of the package before assembly into a module or assembly, to permit rejection of nonconforming packages prior to assembly, and thereby to assure high final module test yields.

In the embodiment of FIG. 24, the z-interconnect pads on the respective substrates are arranged on metal layers near the margins of the substrates. The location and order of the z-interconnect pads are generally arranged so that the z-interconnect pads on the top substrate approximately overlie the corresponding z-interconnect pads on the first package subassembly substrate when the substrate is stacked over the first package subassembly. Conveniently, the top substrate 244 has a smaller substrate footprint than that of the first package subassembly substrate 241, to allow clearance for the wire bonds without electrical shorting to the edges of the metal layers of the substrates.

Once the z-interconnect wire bonds have been formed connecting the second substrate stacked over first package subassembly, an assembly encapsulation 247 is formed, to enclose and protect the z-interconnect wire bonds and to provide mechanical integrity to the completed assembly. The assembly encapsulation 247 covers the area of the upward-facing die side of the second substrate that is not covered by the die, and encloses the wire bonds and wire loops connecting the die with the first package assembly substrate, and covers the vertical walls and edges of the second ("top") substrate and the marginal area of the upward-facing side of the second substrate including the z-interconnect wire loops and the wire bond pads to which the wire bonds are connected. This leaves an area of the land side of the second ("top") substrate exposed for interconnection with one or more devices to be stacked in the cavity over the stacked package assembly. Stated another way, a cavity is formed in the assembly encapsulation on the second substrate side of the assembly, leaving an inboard area 249 of the land side of the second substrate exposed (unencapsulated), on which additional devices such as packages or die can be mounted upon and electrically connected with the land side of the second package substrate, as described in further detail below.

Solder balls 248 are reflowed onto bonding pads on the metal layer on the land side of the first package assembly substrate to provide interconnection to underlying circuitry of, for example, a motherboard (not shown in the FIGS.) of a final product, such as a computer.

As shown by way of example in the FIGS., the first package subassembly substrate may be saw-singulated; alternatively, the module may be individually molded rather than saw-singulated.

Figure 25:
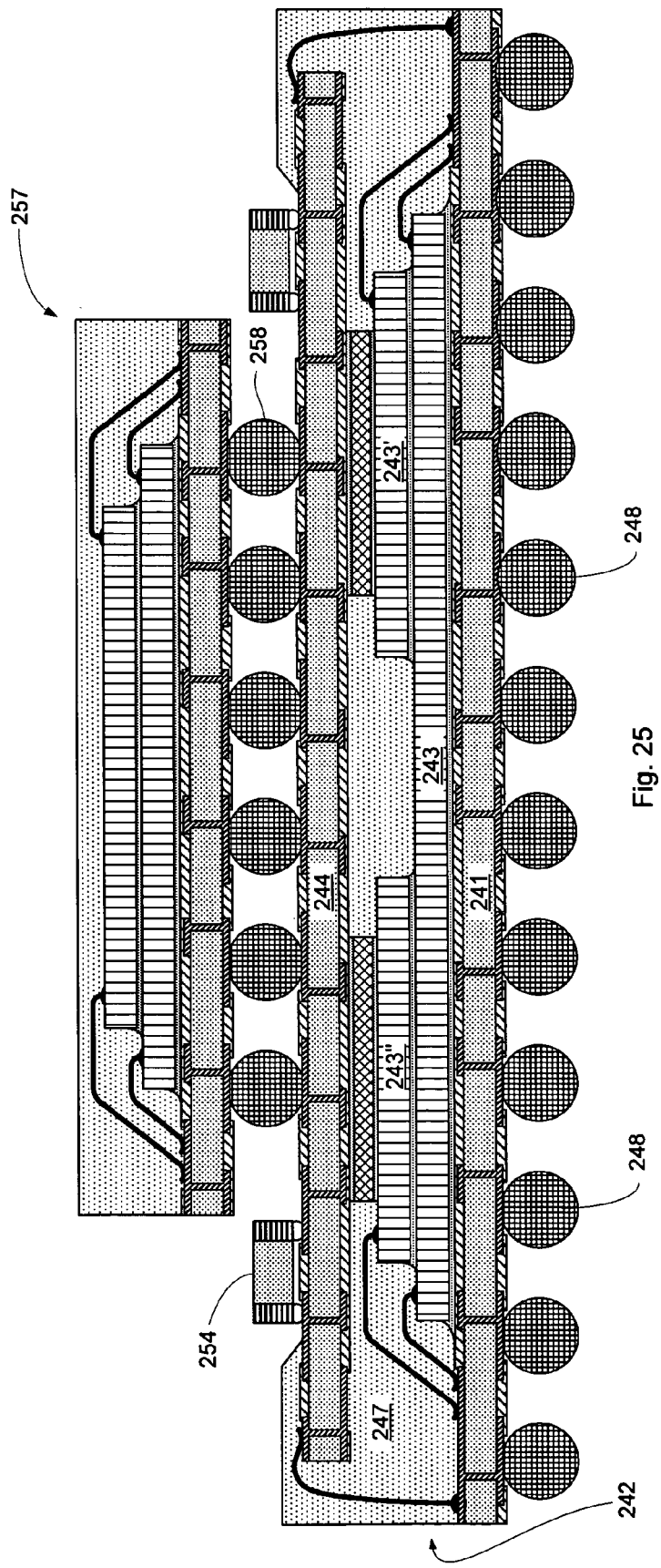
FIG. 25 is a diagrammatic sketch in a sectional view thru an embodiment of a semiconductor package according to an embodiment of the invention, including a BGA stacked over an assembly as in FIG. 24.

FIG. 25 shows an example of a stacked package module employing the stacked package assembly of FIG. 24, in which a ball grid array ("BGA") package is mounted (generally as described with reference to FIG. 7A) upon the exposed area 249 of the land side of the second substrate 244, by solder balls 258. The stacked package module of FIG. 25 also includes passive devices 254 connected at the land side of the second substrate 244.

Any of various substrate types may be used for the first package assembly substrate and the second substrate, including for example: a laminate with 2-6 metal layers, or a build up substrate with 4-8 metal layers, or a flexible polyimide tape with 1-2 metal layers, or a ceramic multilayer substrate. The first package assembly substrate and the second substrate shown by way of example in FIG. 24 each has two metal layers, each patterned to provide appropriate circuitry and connected by way of vias, as described in detail with reference to FIG. 1, for example.

Figure 26:
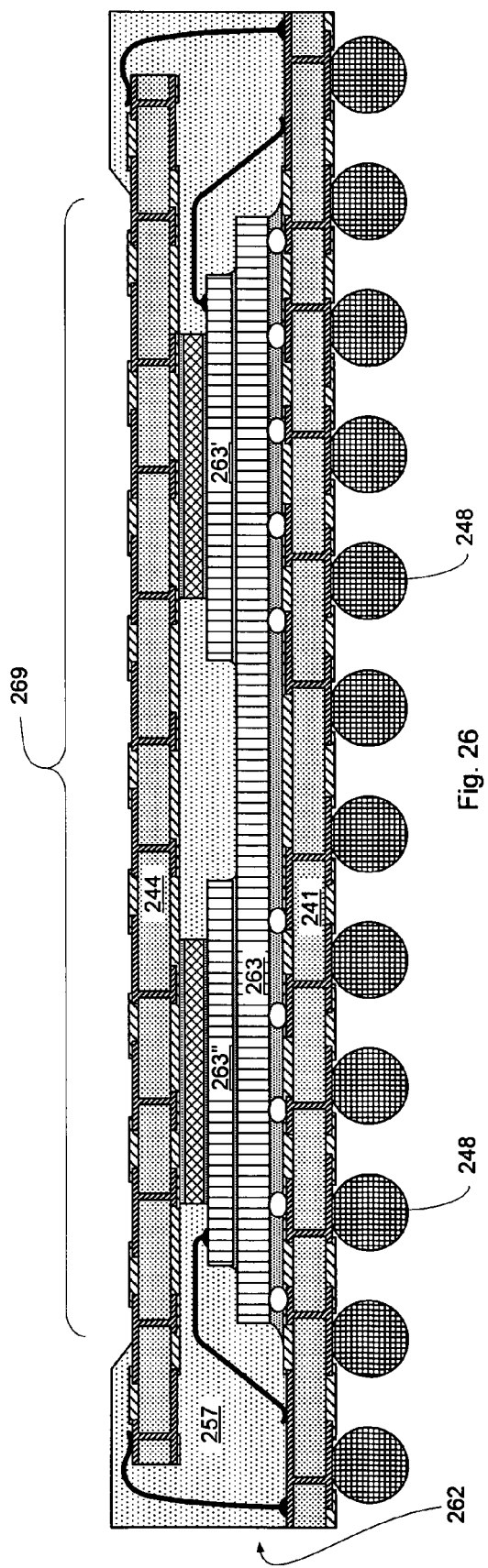
FIG. 26 is a diagrammatic sketch in a sectional view thru in a sectional view thru a semiconductor package assembly according to another embodiment of the invention.

The first die in the first package subassembly can be mounted onto the first assembly substrate by flip chip interconnection, as shown for example in FIG. 26. Referring to FIG. 26, the first package subassembly 262 substrate 241 is constructed as in FIG. 24. A first die 263 is mounted onto the die attach side of the substrate 241. Solder balls or bumps attached to pads on the die are electrically connected with pads on the metal layer at the die attach side of the substrate. An underfill between the die and the substrate serves to protect the electrical interconnections and to provide structural and mechanical integrity and robustness to the interconnection. Second and third die 263', 263" are mounted backside downward, using an adhesive, onto the backside of the flip chip die 263, and are electrically connected with pads on the metal layer at the die attach side of the first assembly substrate 241 by wire bonds. As in the embodiment of FIG. 24, a spacer is mounted upon the uppermost stacked die 263', 263" using an adhesive and a second substrate 244 is affixed over the spacer using an adhesive at the surface of the spacer. Thus, the downward facing surface of the second substrate rests upon the adhesive on the spacer, and the thickness of the spacer, plus the thicknesses of the adhesives is selected to be great enough to accommodate the loop height of the wire bonds connecting the die 263', 263" with the first package assembly substrate 241.

Solder balls 248 are reflowed onto bonding pads on the metal layer on the land side of the first package assembly substrate to provide interconnection to underlying circuitry of, for example, a motherboard (not shown in the FIGS.) of a final product, such as a computer.

An assembly encapsulation 257 covers the area of the upward-facing die side of the second substrate that is not covered by the die, and encloses the wire bonds and wire loops connecting the die with the first package assembly substrate, and covers the vertical walls and edges of the second ("top") substrate and the marginal area of the upward-facing side of the second substrate including the z-interconnect wire loops and the wire bond pads to which the wire bonds are connected. This leaves an area of the land side of the second ("top") substrate exposed for interconnection with one or more devices to be stacked in the cavity over the stacked package assembly. Stated another way, a cavity is formed in the assembly encapsulation on the second substrate side of the assembly, leaving an inboard area 269 of the land side of the second substrate exposed (unencapsulated), on which additional devices such as packages or die can be mounted upon and electrically connected with the land side of the second package substrate.

Figure 27:
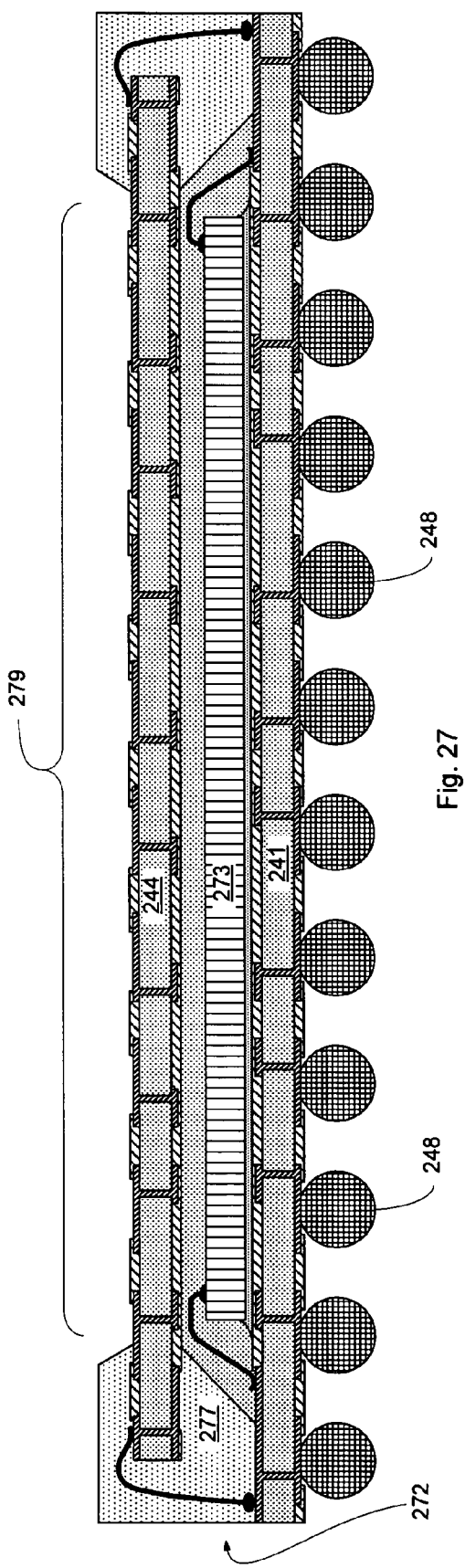
FIG. 27 is a diagrammatic sketch in a sectional view thru in a sectional view thru a semiconductor package assembly according to another embodiment of the invention.

The first package subassembly can be molded, constituting a first (lower) package, as shown for example in FIG. 27. Referring to FIG. 27, the first package subassembly 272 substrate 241 is constructed as in FIG. 24. A die 273 is mounted onto the die attach side of the substrate 241. The die 273 is affixed, backside downward onto, and is electrically connected with pads in the metal layer on the die attach side of, the die attach side of the first assembly substrate 241. A first package molding encloses the active side of the die and the wire bonds, and a second substrate 274 is affixed over the molding using an adhesive at the upward-facing surface of the molding. Thus, the downward facing surface of the second substrate rests upon the adhesive on the first package molding. The molding is thick enough to accommodate the loop height of the wire bonds connecting the die 273 with the first package assembly substrate 241.

Solder balls 248 are reflowed onto bonding pads on the metal layer on the land side of the first package assembly substrate to provide interconnection to underlying circuitry of, for example, a motherboard (not shown in the FIGS.) of a final product, such as a computer.

An assembly encapsulation 277 covers the area of the upward-facing die side of the second substrate that is not covered by the die, and encloses the wire bonds and wire loops connecting the die with the first package assembly substrate, and covers the vertical walls and edges of the second ("top") substrate and the marginal area of the upward-facing side of the second substrate including the z-interconnect wire loops and the wire bond pads to which the wire bonds are connected. This leaves an area of the land side of the second ("top") substrate exposed for interconnection with one or more devices to be stacked in the cavity over the stacked package assembly. Stated another way, a cavity is formed in the assembly encapsulation on the second substrate side of the assembly, leaving an inboard area 279 of the land side of the second substrate exposed (unencapsulated), on which additional devices such as packages or die can be mounted upon and electrically connected with the land side of the second package substrate.

Figure 28:
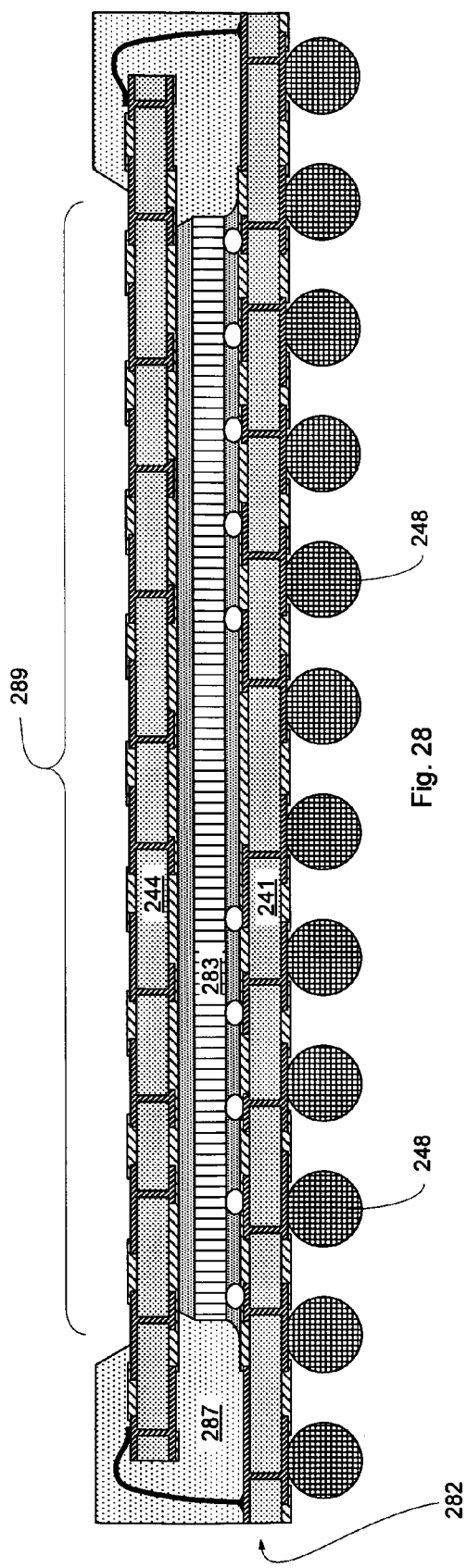
FIG. 28 is a diagrammatic sketch in a sectional view thru in a sectional view thru a semiconductor package assembly according to another embodiment of the invention.

FIG. 28 illustrates a package assembly in which the first subassembly constitutes a flip chip package 282. Referring to FIG. 28, the first package assembly substrate 241 is constructed as in FIG. 24. A die 283 is mounted onto the die attach side of the substrate 241. Solder balls or bumps attached to pads on the die are electrically connected with pads on the metal layer at the die attach side of the substrate. An underfill between the die and the substrate serves to protect the electrical interconnections and to provide structural and mechanical integrity and robustness to the interconnection. In this embodiment no additional die are stacked over the flip chip die. A second substrate 244 is affixed over the flip chip die using an adhesive at the backside surface of the die. Thus, the downward facing surface of the second substrate rests upon the adhesive on the die.

Solder balls 248 are reflowed onto bonding pads on the metal layer on the land side of the first package assembly substrate to provide interconnection to underlying circuitry of, for example, a motherboard (not shown in the FIGS.) of a final product, such as a computer.

An assembly encapsulation 287 covers the area of the upward-facing die side of the second substrate that is not covered by the die, and encloses the wire bonds and wire loops connecting the die with the first package assembly substrate, and covers the vertical walls and edges of the second ("top") substrate and the marginal area of the upward-facing side of the second substrate including the z-interconnect wire loops and the wire bond pads to which the wire bonds are connected. This leaves an area of the land side of the second ("top") substrate exposed for interconnection with one or more devices to be stacked in the cavity over the stacked package assembly. Stated another way, a cavity is formed in the assembly encapsulation on the second substrate side of the assembly, leaving an inboard area 289 of the land side of the second substrate exposed (unencapsulated), on which additional devices such as packages or die can be mounted upon and electrically connected with the land side of the second package substrate.

Figure 29:
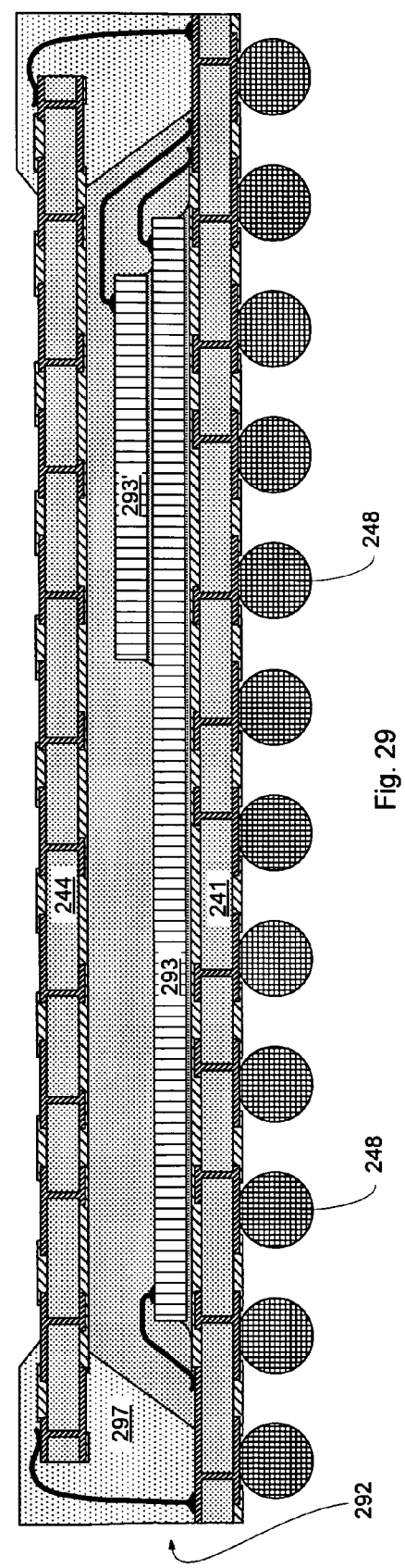
FIG. 29 is a diagrammatic sketch in a sectional view thru in a sectional view thru a semiconductor package assembly according to another embodiment of the invention.

FIG. 29 illustrates a package assembly in which the first subassembly constitutes a BGA (or LGA) package having a die wire bonded to the first package subassembly substrate. Referring to FIG. 29, the first package assembly substrate 241 is constructed as in FIG. 24. A first die 293 is mounted backside downward onto the die attach side of the substrate 241, and is electrically connected by wire bonds with pads on the metal layer at the die attach side of the substrate. A second die 293' is mounted backside downward onto the first die 293, and is electrically connected by wire bonds with pads on the metal layer at the die attach side of the substrate. A first package molding encloses the active side of the die and the wire bonds, and a second substrate 244 is affixed over the molding using an adhesive at the upward-facing surface of the molding. Thus, the downward facing surface of the second substrate rests upon the adhesive on the first package molding. The molding is thick enough to accommodate the loop height of the wire bonds connecting the die 293, 293' with the first package assembly substrate 241.

Solder balls 248 are reflowed onto bonding pads on the metal layer on the land side of the first package assembly substrate to provide interconnection to underlying circuitry of, for example, a motherboard (not shown in the FIGS.) of a final product, such as a computer.

An assembly encapsulation 297 covers the area of the upward-facing die side of the second substrate that is not covered by the die, and encloses the wire bonds and wire loops connecting the die with the first package assembly substrate, and covers the vertical walls and edges of the second ("top") substrate and the marginal area of the upward-facing side of the second substrate including the z-interconnect wire loops and the wire bond pads to which the wire bonds are connected. This leaves an area of the land side of the second ("top") substrate exposed for interconnection with one or more devices to be stacked in the cavity over the stacked package assembly. Stated another way, a cavity is formed in the assembly encapsulation on the second substrate side of the assembly, leaving an inboard area 299 of the land side of the second substrate exposed (unencapsulated), on which additional devices such as packages or die can be mounted upon and electrically connected with the land side of the second package substrate.

Figure 30:
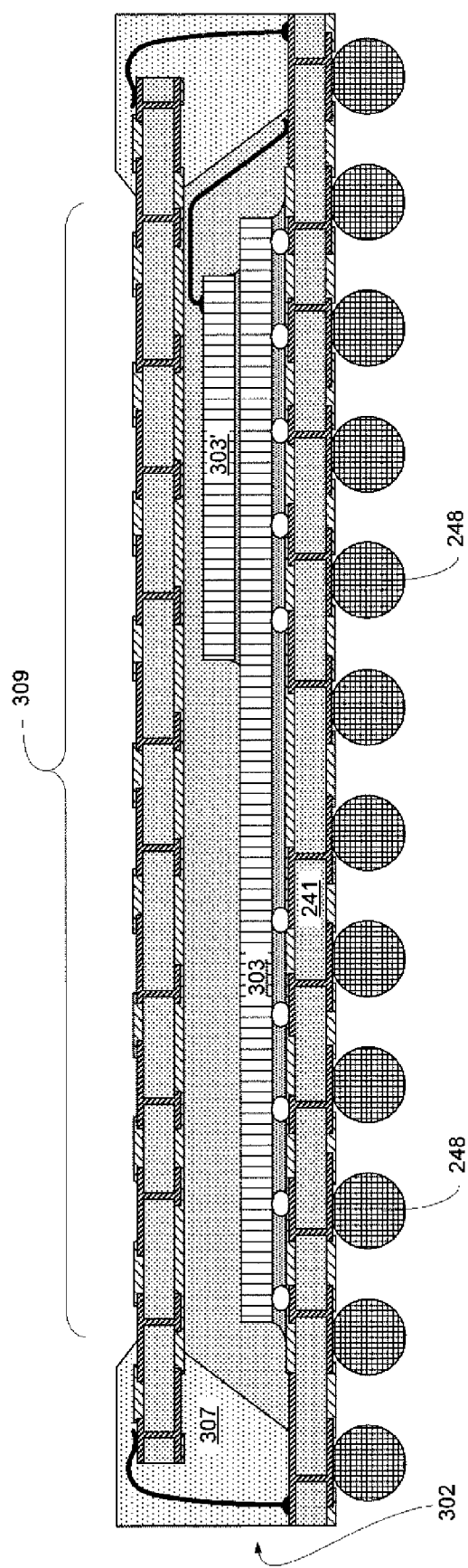
FIG. 30 is a diagrammatic sketch in a sectional view thru in a sectional view thru a semiconductor package assembly according to another embodiment of the invention.

FIG. 30 illustrates a package assembly generally similar to that shown in FIG. 29, in which the first package die is a flip chip die rather than a wire bonded die. Referring to FIG. 30, the first package assembly substrate 241 is constructed as in FIG. 24. A first die 303 is mounted onto the die attach side of the substrate 241. Solder balls or bumps attached to pads on the die are electrically connected with pads on the metal layer at the die attach side of the substrate. An underfill between the die and the substrate serves to protect the electrical interconnections and to provide structural and mechanical integrity and robustness to the interconnection. In this example a second die 303' is mounted backside downward onto the first die 303, and is electrically connected by wire bonds with pads on the metal layer at the die attach side of the substrate. A first package molding encloses the active side of the die and the wire bonds, and a second substrate 244 is affixed over the molding using an adhesive at the upward-facing surface of the molding. Thus, the downward facing surface of the second substrate rests upon the adhesive on the first package molding. The molding is thick enough to accommodate the loop height of the wire bonds connecting the die 303' with the first package assembly substrate 241.

Solder balls 248 are reflowed onto bonding pads on the metal layer on the land side of the first package assembly substrate to provide interconnection to underlying circuitry of, for example, a motherboard (not shown in the FIGS.) of a final product, such as a computer.

An assembly encapsulation 307 covers the area of the upward-facing die side of the second substrate that is not covered by the die, and encloses the wire bonds and wire loops connecting the die with the first package assembly substrate, and covers the vertical walls and edges of the second ("top") substrate and the marginal area of the upward-facing side of the second substrate including the z-interconnect wire loops and the wire bond pads to which the wire bonds are connected. This leaves an area of the land side of the second ("top") substrate exposed for interconnection with one or more devices to be stacked in the cavity over the stacked package assembly. Stated another way, a cavity is formed in the assembly encapsulation on the second substrate side of the assembly, leaving an inboard area 309 of the land side of the second substrate exposed (unencapsulated), on which additional devices such as packages or die can be mounted upon and electrically connected with the land side of the second package substrate Any of the various platforms shown by way of example in FIGS. 24 and 26-30 can be employed according to the invention to provide stacked package modules, by stacking one or more additional devices in the cavity over the exposed area of the second substrate. An example is shown in FIG. 25, where the additional device includes a BGA package. Other additional devices may be stacked over any of the assemblies, in the manner shown in FIGS. for stacking additional devices over an assembly according to FIG. 4, as illustrated by way of example in FIGS. 8-14. Additional component mat include, for example: a ball grid array (BGA) package, which may be a stacked die BGA; or an additional LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices.

As will be appreciated, in all its various aspects the invention features an assembly having a first package subassembly and a second substrate stacked over the first package assembly, and having wire bonding z-interconnect between the first package substrate and the second substrate, in which the assembly is encapsulated in such a way that the land side of one of the substrates is exposed and a portion of the land side of the other substrate is exposed.

Moreover, the package assembly constitutes a platform for combination with any of a variety of additional components. Accordingly, in various configurations second level interconnection of the assembly is made at the land side of one of the substrates, and one or more additional, components are stacked over the land side of the other substrate. The additional components may be selected by the manufacturer on the product assembly floor, and may be selected from among off-the-shelf components.

The semiconductor assembly of the invention can be employed in any of a diverse variety of applications, such as, for example, computers, portable communications devices, consumer products.

The semiconductor assembly according to the invention can be used for building computers, and, for example, in telecommunications, consumer and industrial electronics devices. The invention provides for assembly of more than one semiconductor in a thin and minimal footprint package at high final test yields. Construction of the individual packages allows testing before they are assembled into the assembly, assuring that only acceptably good package components are employed in assembly and, accordingly, ensuring high assembly yields.

The invention provides for flexibility in design, particularly in selection of components having selected functionalities, and enables the use of standard packages, reducing the need for custom design and reducing cost.

Procedures in processes for making the various packages and for routing package substrates for use in the invention are well established in the industry.

The assembly process is similar for the configurations according to the various aspects of the invention. Generally, the process includes steps of: providing a ball grid array or land grid array substrate, preferably as a strip of ball grid array (BGA) or land grid array (LGA) substrates; mounting die and interconnections onto the BGA or LGA substrate to form the package subassembly; mounting a spacer or spacer assembly upon the package subassembly, for example as a spacer mounted upon the package die and provided with an adhesive on the surface, or as adhesive spacers mounted upon the first package substrate; mounting a second substrate upon the adhesive on the spacer or upon the adhesive spacers; curing the adhesive or adhesive spacers; performing a plasma clean; wire bonding to form z-interconnection between the first side of the second substrate and the land side of the first package substrate; performing a plasma clean; performing a molding operation to enclose the first side of the substrate, the z-interconnection wire bonds and wire loops, the edges of the first package substrate, and the marginal area on the land side of the first package substrate, leaving exposed the second ("land") side of the second substrate and an area of the land side of the first package substrate located within a marginal area; attaching second level interconnect solder balls to sites on the exposed area of the first package substrate; and (where the second substrate was provided in a strip or array) saw singulating to complete the package.

Advantageously, the package can be tested prior to assembly, and packages not meeting requirements for performance or reliability can be discarded, so that first packages tested as "good" are used in the assembled module. Testing of CSPs is well established in the industry, and typically is done by accessing contact to the solder ball pads. The completed assembly can be tested in the same manner as for testing BGAs.

Figure 15:
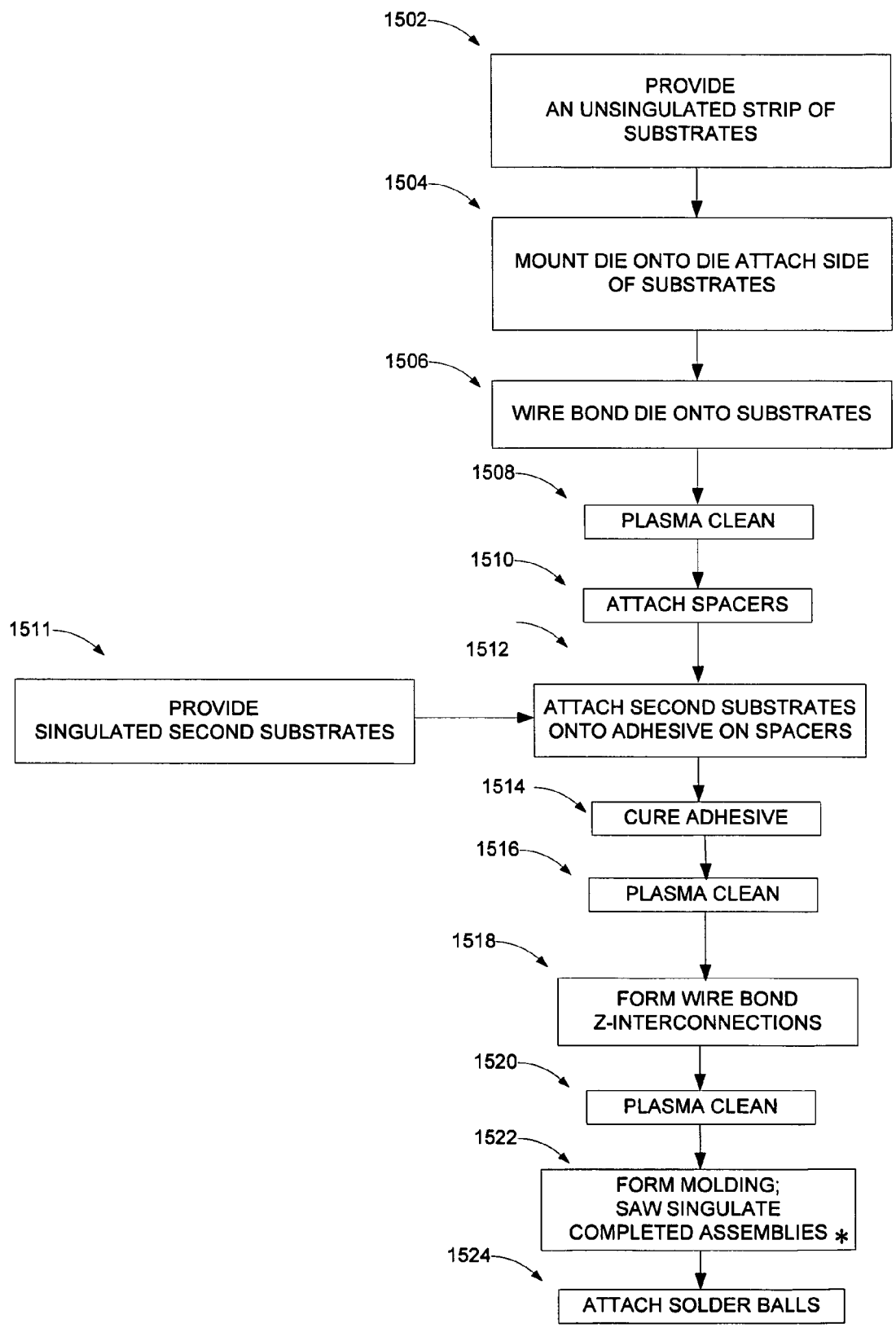
FIG. 15 is a diagram showing steps in a process for making a semiconductor assembly according to an embodiment of the invention.
Figure 16A:
FIGS. 16A-23B are diagrams in paired sectional (16A, 17A, 18A, 19A, 20A, 21A, 22A, 23A) and plan (16B, 17B, 18B, 19B, 20B, 21B, 22B, 23B) views showing stages in a process for making a package according to an embodiment of the invention.
Figure 16B:
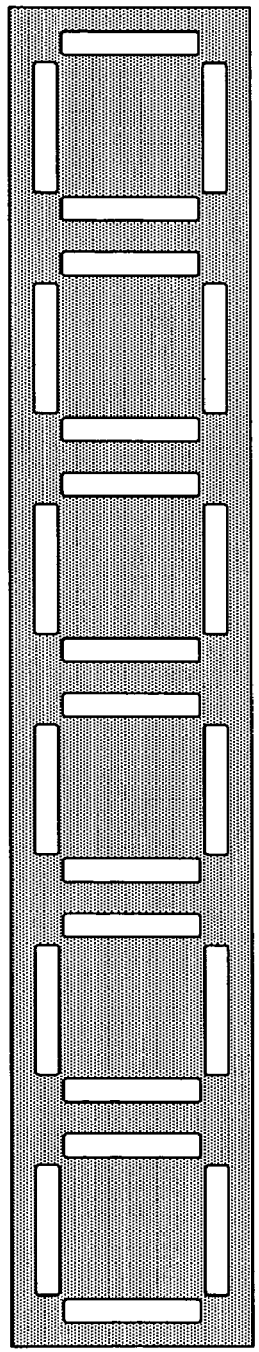
Figure 17A:
Figure 17B:
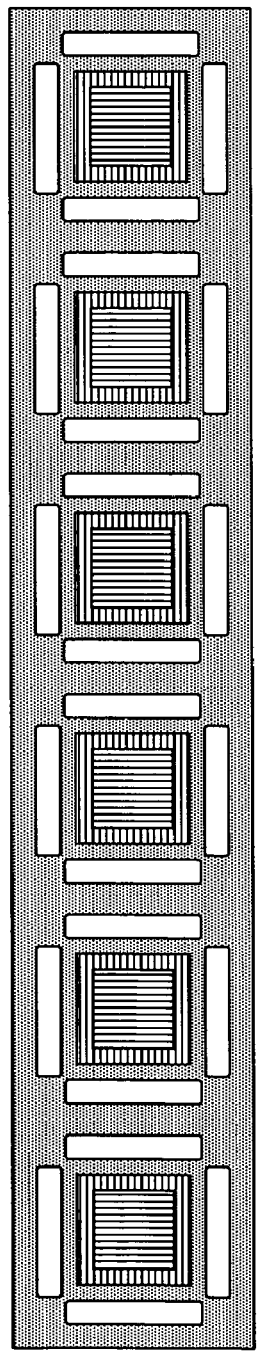
Figure 18A:
Figure 18B:
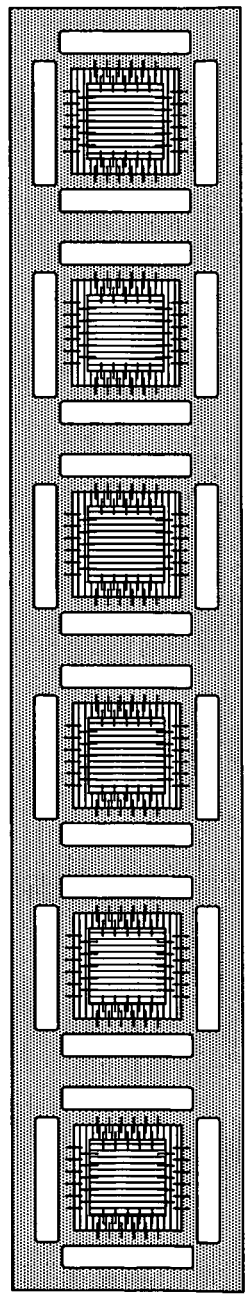
Figure 19A:
Figure 19B:
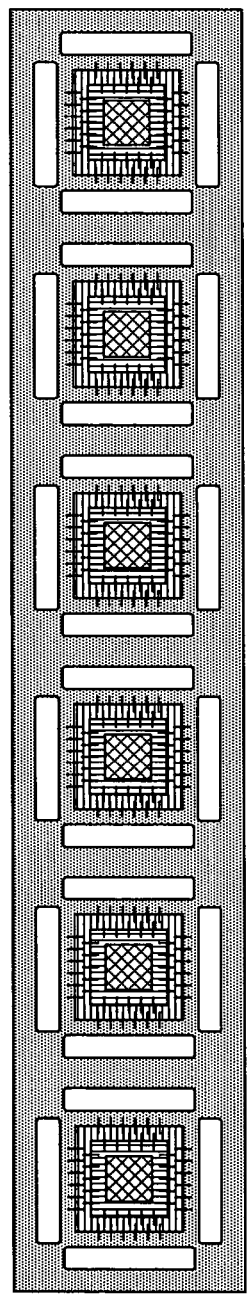
Figure 20A:
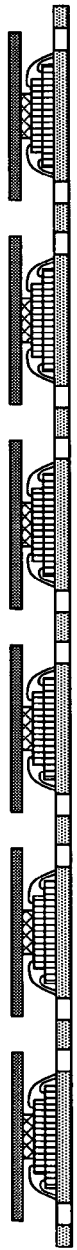
Figure 20B:
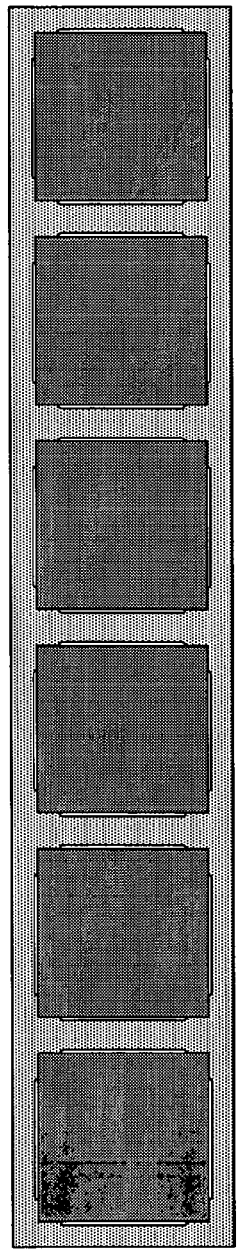
Figure 21A:
Figure 21B:
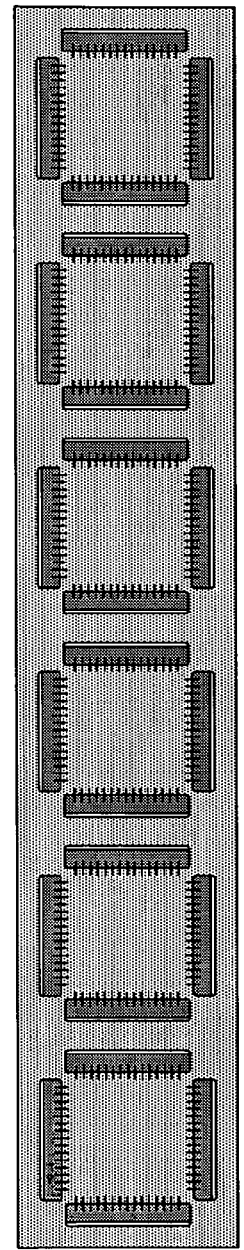
Figure 22A:
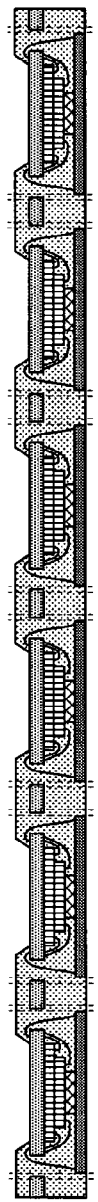
Figure 22B:
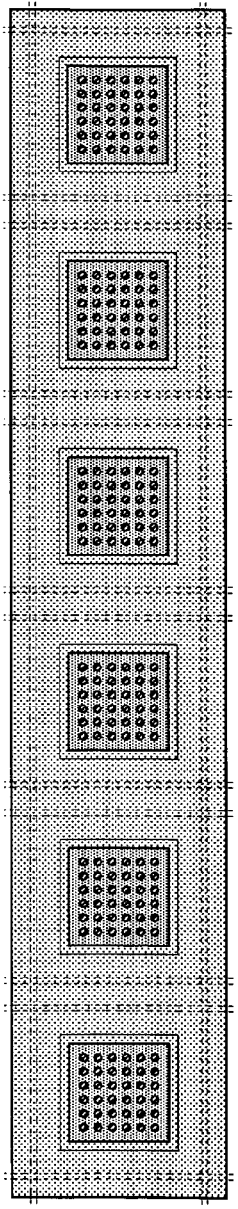
Figure 23A:
Figure 23B:
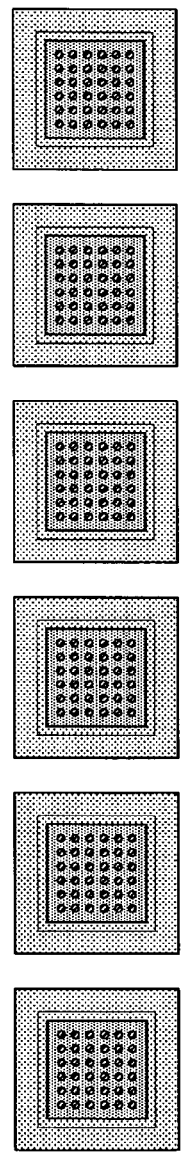

FIG. 15 is a flow diagram showing a process for assembly of a stacked package assembly as shown for example in FIG. 3; and FIGS. 16A-23B are diagrams in paired sectional and plan views showing stages in such a process In a step 1502, an unsingulated strip of substrates is provided, FIGS. 16A, 16B. In a step 1504, die are mounted onto the die attach side of the substrates, FIGS. 17A, 17B, and in a step 1506, the die are wire bonded to the metal layer at the die attach side of the substrates, FIGS. 18A, 18B, to form package subassemblies. In a step 1508, a plasma clean is performed. In a step 1510 a spacer is attached to the package subassembly (onto the uppermost die in the examples shown in the FIGS.), FIGS. 19A, 19B, and an adhesive is applied to the spacers. In a step 1511 singulated second substrates are provided, and in a step 1512 the second substrates are affixed onto the adhesive on the spacers, FIGS. 20A, 20B, and in a step 1514, the adhesive is cured. In a step 1516, a plasma clean operation is performed in preparation for a step 1518 in which wire bond z-interconnections are formed through slots in the strip of substrates, FIGS. 21A, 21B. In a step 1520, an additional plasma clean may be performed, followed by the formation of the stacked package assembly molding in a step 1522, FIGS. 22A, 22B, and singulation of the packages, FIGS. 23A, 23B. The molding apparatus is configured to allow molding compound to encapsulate the z-interconnection wire loops, and to prevent incursion of molding compound into an inner area of the land side of the first package substrate. In a step 1524, the second-level interconnect solder balls are attached to the exposed inner area of the land side of the package, and the completed assemblies are tested (*) and singulated from the strip by saw singulation, and packaged for further use.

As will be appreciated, individual ones of the various steps in the processes according to the invention can be carried out, according to the methods described herein, using substantially conventional techniques, with straightforward modification, as described herein, of conventional fabrication facilities. Such variation of conventional techniques and modification of conventional fabrication apparatus as may be required can be accomplished using the description herein without undue experimentation.

Other embodiments are within the following claims.

What is claimed is:

1. A semiconductor package assembly, comprising at least one die mounted upon and electrically connected to, a die attach side of a first package assembly substrate, and comprising a second substrate mounted over the first package die, the side of the first package substrate opposite the die attach side being a land side of the substrate, the second substrate having a first side facing the die attach side of the first package substrate, and a second side, being the land side, facing away from the die attach side of the first package substrate, so that the land sides of the substrates face away from one another, wherein z-interconnection between the first package substrate and the second substrate is by wire bonds between wire bond sites in a marginal area on the land side of the first package substrate and peripherally located wire bond sites in a marginal area on the first side of the second substrate and connecting the first package assembly substrate and the second substrate, and wherein the package is encapsulated so that both at least a portion of the second substrate at one side of the package and at least a portion of the first package substrate at an opposite side of the assembly are exposed.

2. The assembly of claim 1 wherein the second substrate is larger than the first package substrate.

3. The assembly of claim 2 wherein the assembly encapsulation covers an area of the first side of the second substrate not contacted by a spacer or spacer structure, and encloses the z-interconnection wire bonds and wire loops, the edges of the first package, and the marginal area on the land side of the first package, so that both the land side of the second substrate and the area of the land side of the first substrate located within the marginal area, are left exposed.

4. The assembly of claim 3 wherein the assembly encapsulation covers an area of the first side of the second substrate not contacted by a spacer or spacer structure, and encloses the z-interconnection wire bonds and wire loops, the edges of the second package, and the marginal area on the land side of the second package, so that both the land side of the first substrate, and the area of the land side of the second substrate located within the marginal area, are left exposed.

5. The assembly of claim 1 wherein the first substrate is larger than the second package substrate.

6. The assembly of claim 1 wherein the first package assembly die is electrically connected with the first package substrate by wire bonds.

7. The assembly of claim 6 wherein the second substrate is supported over the first package die by a spacer, providing sufficient space between the first side of the substrate and the top of the die to accommodate a wire loop height.

8. The assembly of claim 6 wherein the second substrate is supported over the first package die by a spacer assembly, providing sufficient space between the first side of the substrate and the top of the die to accommodate a wire loop height.

9. The assembly of claim 6 wherein the second substrate is supported over the first package die by a spacer mounted upon the first package die.

10. The assembly of claim 6 wherein the second substrate is supported over the first package die by a spacer mounted upon the first package substrate.

11. The assembly of claim 1 wherein z-interconnection between the first package substrate and the second substrate is by wire bonds between wire bond sites in the marginal area on the land side of the second package substrate and peripherally located wire bond sites in a marginal area on the first side of the first substrate.

12. The assembly of claim 1 wherein the first package die and the first package substrate, together with the electrical interconnection of the die with the substrate, constitute a package subassembly.

13. The assembly of claim 12 wherein the first package comprises a ball grid array substrate, and wherein second level interconnection of the package to underlying circuitry is made by interconnection at the exposed part of land side of the first package substrate.

14. The assembly of claim 12 wherein the first package comprises a ball grid array substrate, and wherein second level interconnection of the package to underlying circuitry is made by interconnection at the exposed land side of the second substrate.

15. The assembly of claim 12 wherein the first package assembly substrate is larger than the second substrate, and second level interconnection of the package to underlying circuitry is made by solder ball interconnection at the land side of the first assembly substrate.

* * * * *